United States Patent
Lai et al.

(10) Patent No.: US 11,800,718 B2
(45) Date of Patent: Oct. 24, 2023

(54) SEMICONDUCTOR MEMORY DEVICE WITH GATE LINE PASSING THROUGH SOURCE/DRAIN, CHANNEL AND DIELECTRIC LAYERS OVER VIA

(71) Applicant: Taiwan Semiconductor Manufacturing Company, Ltd., Hsinchu (TW)

(72) Inventors: Sheng-Chih Lai, Hsinchu County (TW); Chung-Te Lin, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 197 days.

(21) Appl. No.: 17/375,498

(22) Filed: Jul. 14, 2021

(65) Prior Publication Data
US 2021/0343730 A1 Nov. 4, 2021

Related U.S. Application Data

(62) Division of application No. 16/413,859, filed on May 16, 2019, now Pat. No. 11,081,493.

(51) Int. Cl.
| | |
|---|---|
| *H10B 43/35* | (2023.01) |
| *G11C 5/06* | (2006.01) |
| *H10B 43/10* | (2023.01) |
| *H10B 43/40* | (2023.01) |

(52) U.S. Cl.
CPC .............. *H10B 43/35* (2023.02); *G11C 5/063* (2013.01); *H10B 43/10* (2023.02); *H10B 43/40* (2023.02)

(58) Field of Classification Search
CPC ........ H10B 43/35; H10B 43/40; H10B 43/10; G11C 5/063
See application file for complete search history.

(56) References Cited

U.S. PATENT DOCUMENTS

| | | | |
|---|---|---|---|
| 9,960,181 B1 | 5/2018 | Cui et al. | |
| 2015/0221667 A1 | 8/2015 | Fukuzumi et al. | |
| 2015/0236038 A1 | 8/2015 | Pachamuthu et al. | |
| 2017/0062454 A1* | 3/2017 | Lu | ........ H01L 21/76877 |
| 2017/0236746 A1* | 8/2017 | Yu | ............ H10B 43/40 257/314 |
| 2017/0352678 A1* | 12/2017 | Lu | ........ H01L 29/66833 |

* cited by examiner

*Primary Examiner* — Lex H Malsawma
(74) *Attorney, Agent, or Firm* — Birch, Stewart, Kolasch & Birch, LLP

(57) ABSTRACT

A semiconductor memory device is provided. The semiconductor memory device includes a via above a substrate, a dielectric layer over the via, a first source/drain feature above the dielectric layer, a first channel feature above the first source/drain feature, a second source/drain feature above the first channel feature, and a gate line laterally spaced apart from the first source/drain feature, the first channel feature and the second source/drain feature. The gate line passes through the dielectric layer and is on the via.

20 Claims, 28 Drawing Sheets

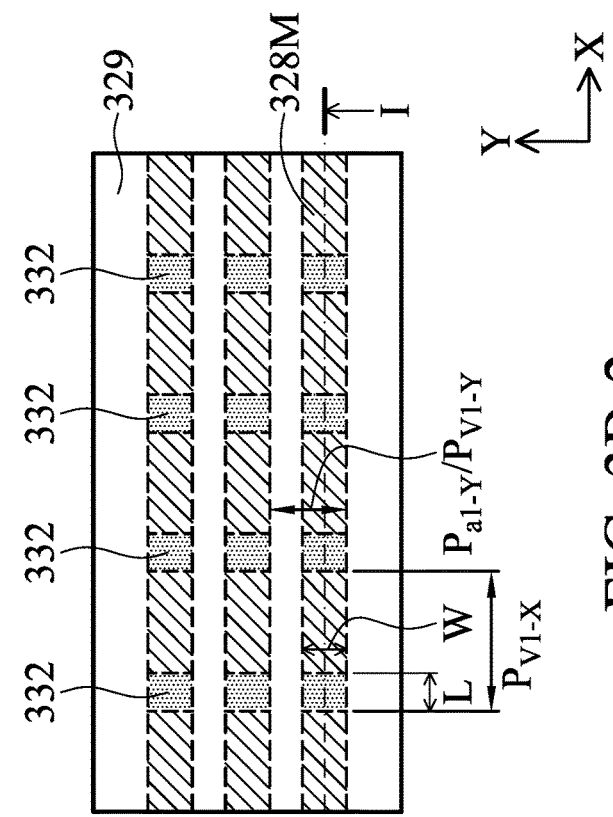
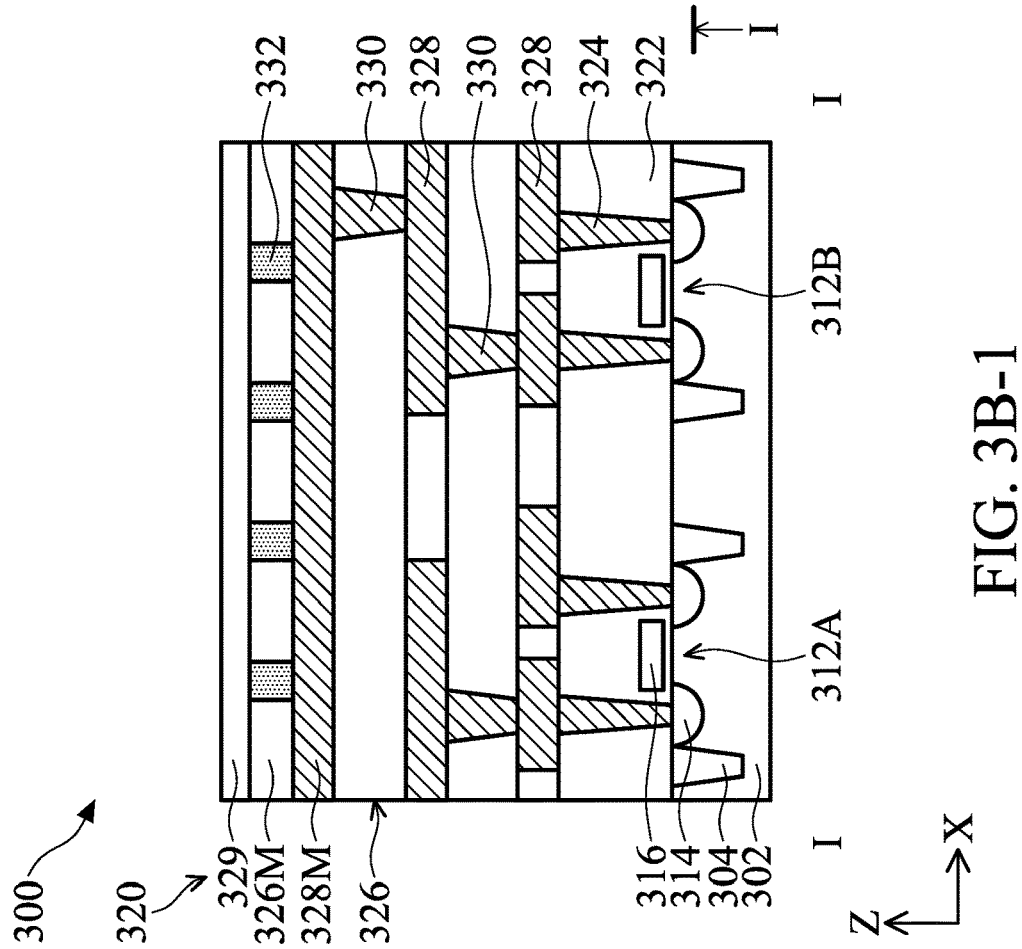
FIG. 3B-2
FIG. 3B-1

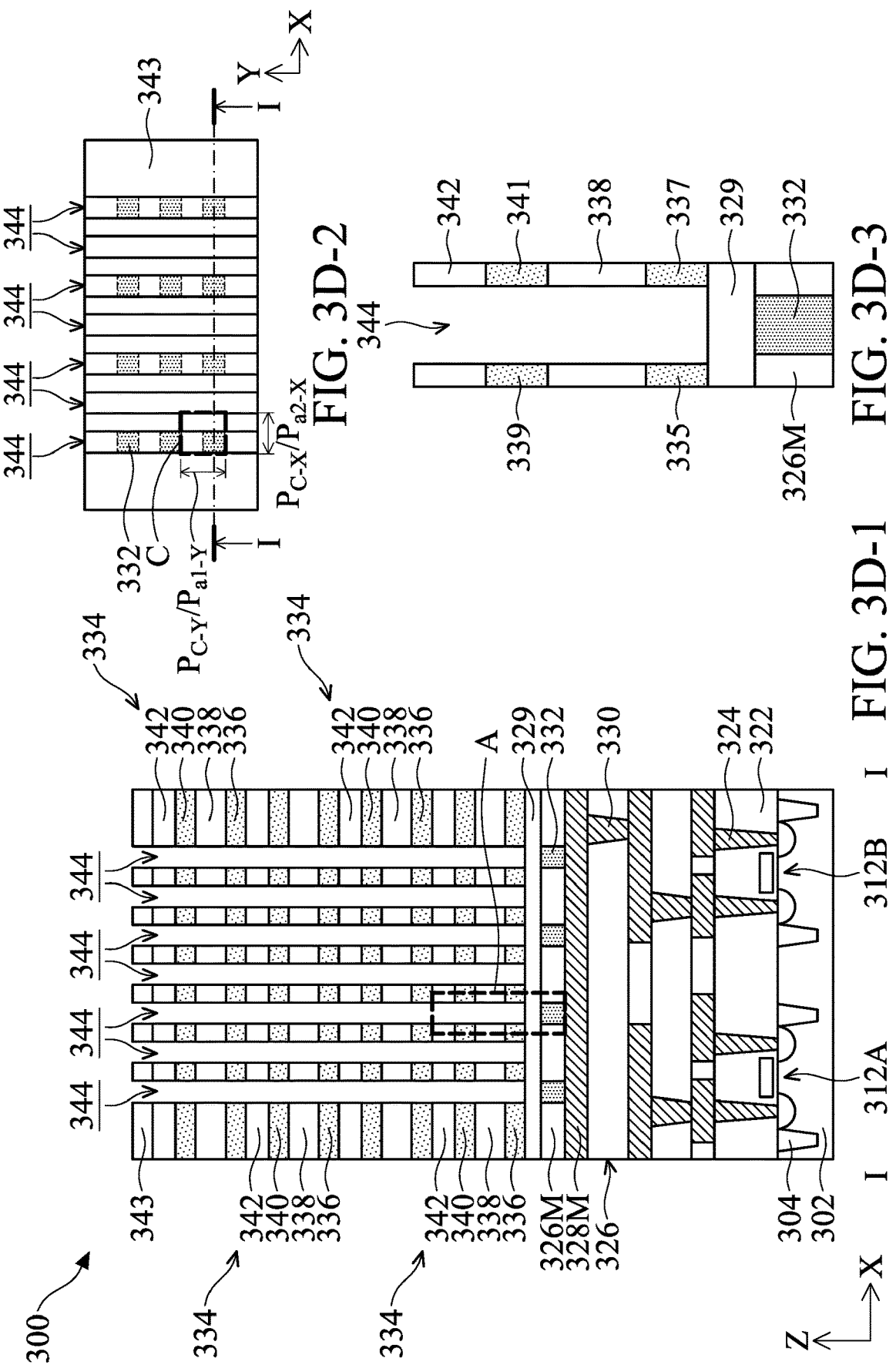

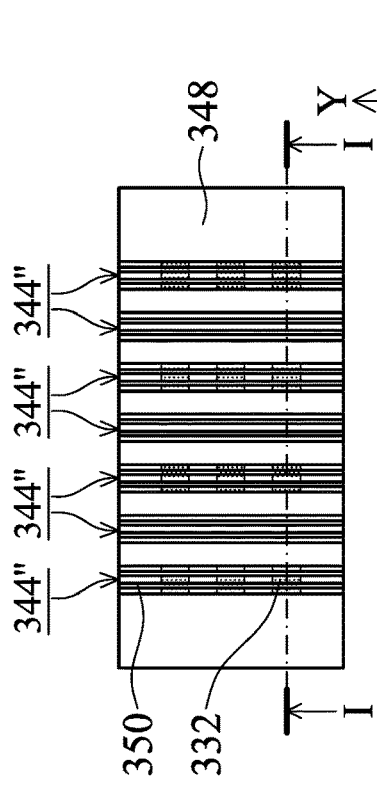
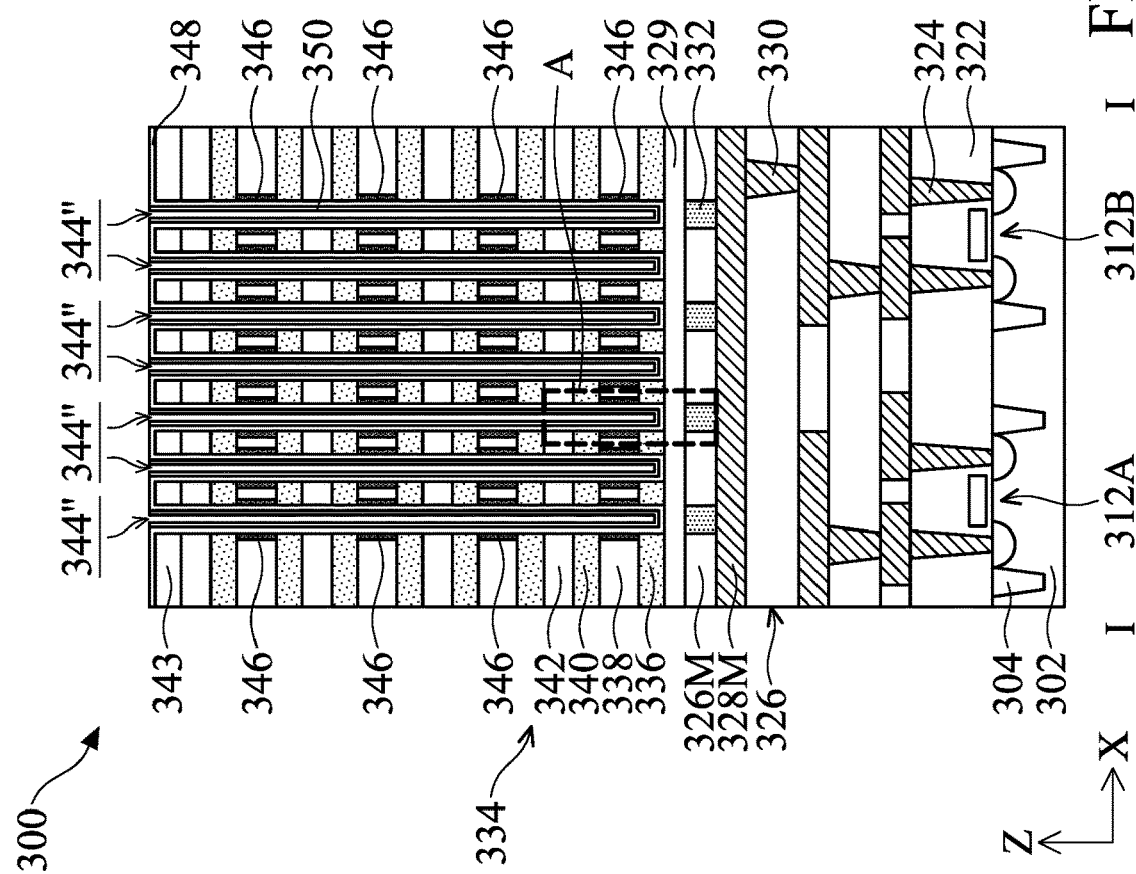
FIG. 3G-1  FIG. 3G-2  FIG. 3G-3

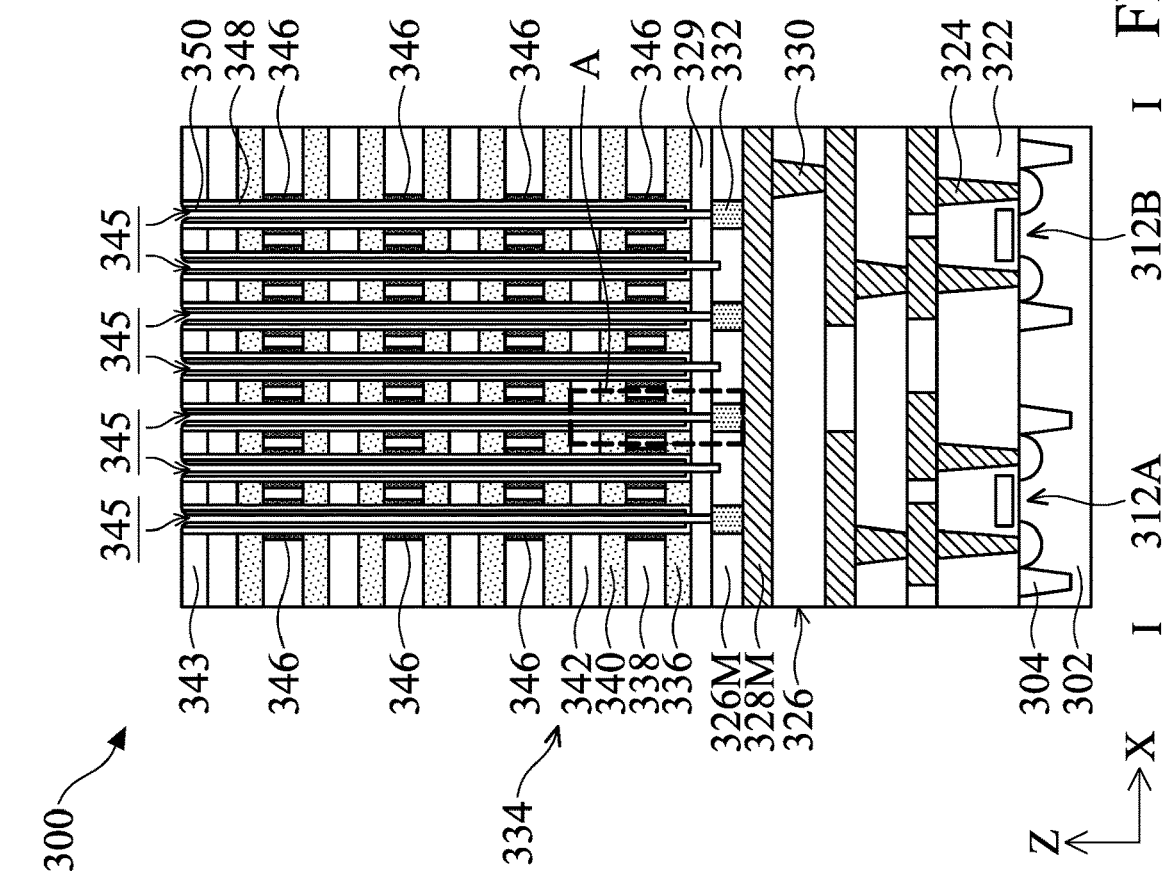

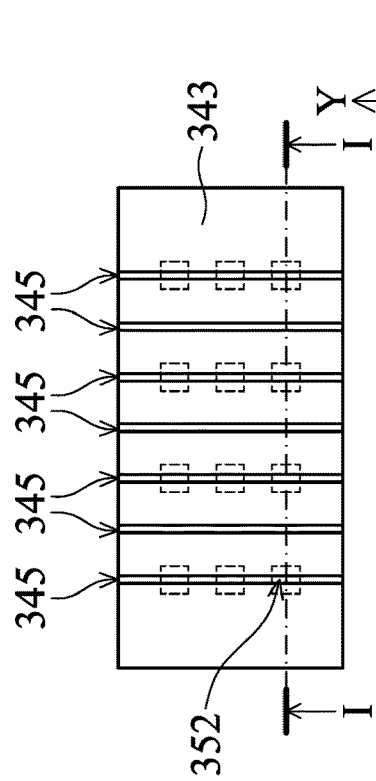
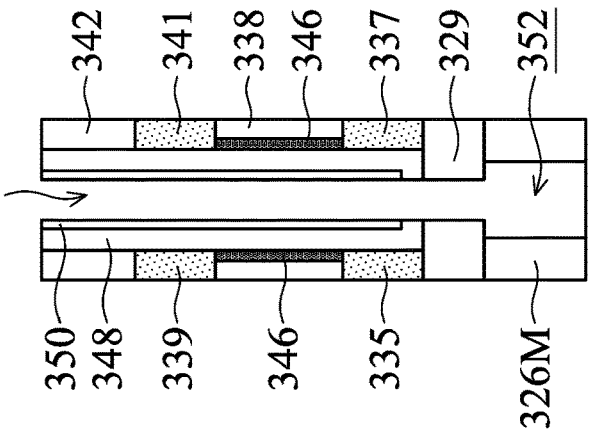
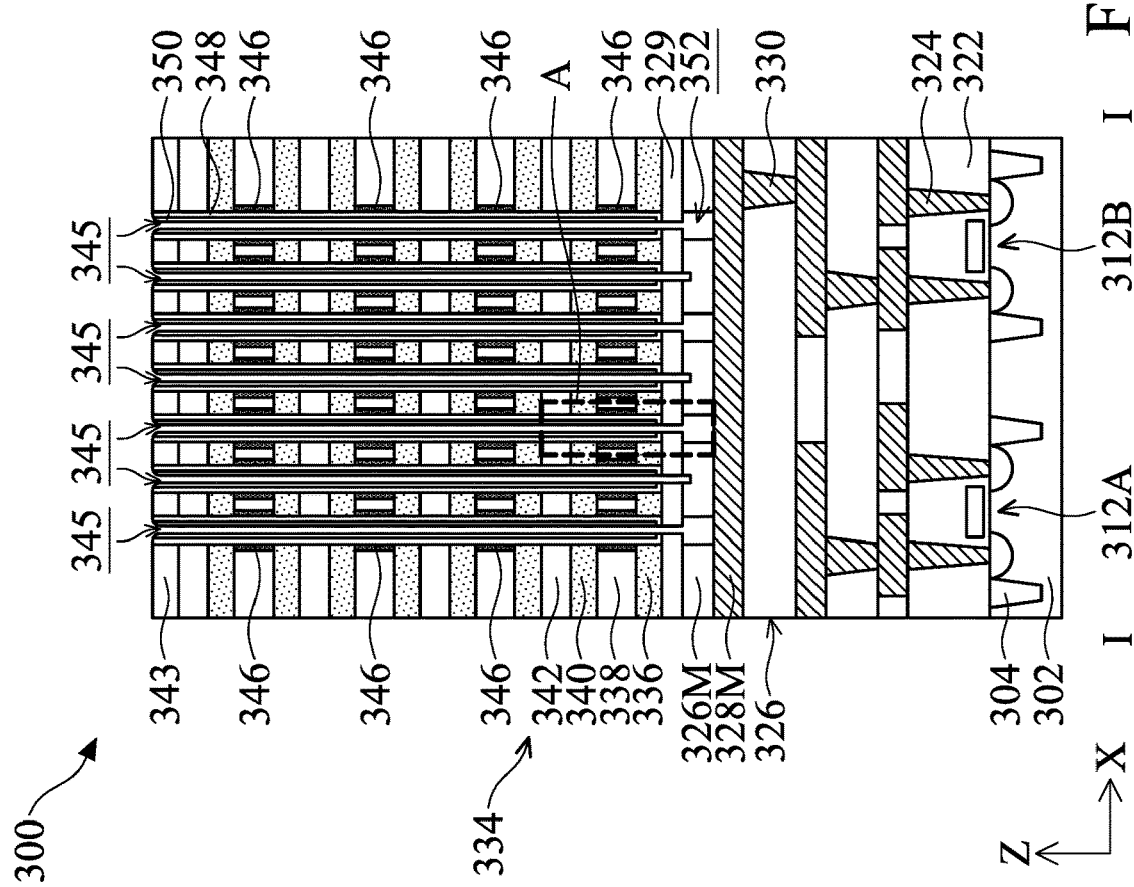
FIG. 3I-2
FIG. 3I-3
FIG. 3I-1

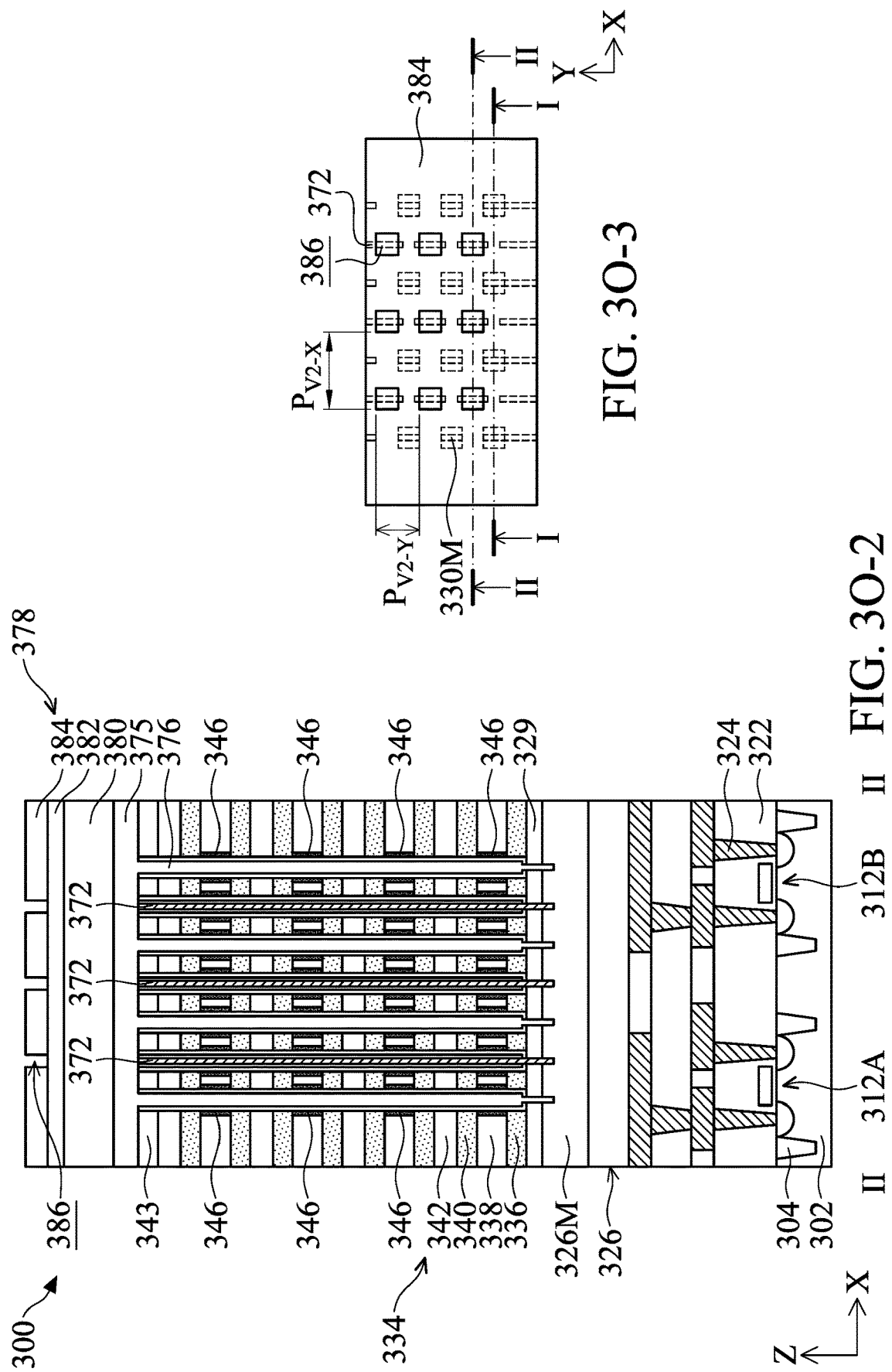

SEMICONDUCTOR MEMORY DEVICE WITH GATE LINE PASSING THROUGH SOURCE/DRAIN, CHANNEL AND DIELECTRIC LAYERS OVER VIA

PRIORITY CLAIM AND CROSS-REFERENCE

This application is a divisional application of U.S. patent application Ser. No. 16/413,859, filed on May 16, 2019, entitled of "SEMICONDUCTOR MEMORY DEVICE AND METHOD FOR FORMING THE SAME," which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

One type of device targeted for increased capacity and integration are memory devices. A reduction in memory device cell design has led to challenges in interconnect structure providing access and operation to these memory device cells. Furthermore, the peripheral devices used to access these memory device cells have been targeted for improvements in integration.

Therefore, although conventional semiconductor devices have been generally adequate for their intended purposes, they are not satisfactory in every respect.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 3A-1, 3B-1, 3C, 3D-1, 3E-1, 3F-1, 3G-1, 3H-1, 3I-1, 3J-1, 3K, 3L-1, 3M-1, 3M-2, 3N-1, 3N-2, 3O-1, 3O-2, 3P-1, 3P-2, 3Q-1, 3Q-2, 3R-1, and 3R-2 are cross-sectional views of the formation of a semiconductor memory device at various intermediate stages, in accordance with some embodiments of the disclosure.

FIGS. 3A-2, 3B-2, 3D-2, 3F-2, 3G-2, 3H-2, 3I-2, 3J-2, 3L-2, 3M-3, 3N-3, 3O-3, 3P-3, 3Q-3 and 3R-3 are top views of the formation of a semiconductor memory device at various intermediate stages, in accordance with some embodiments of the disclosure.

FIGS. 3D-3, 3E-2, 3F-3, 3G-3, 3H-3, 3I-3, and 3J-3 are enlarged views of area A shown in FIGS. 3D-1, 3E-1, 3F-1, 3G-1, 3H-1, 3I-1, and 3J-1, in accordance with some embodiments of the disclosure.

FIG. 4-1 is a cross-sectional view of a semiconductor memory device, in accordance with some embodiments of the disclosure.

FIG. 4-2 is an enlarged view of area A shown in FIG. 4-1, in accordance with some embodiments of the disclosure.

DETAILED DESCRIPTION

Figure 1:
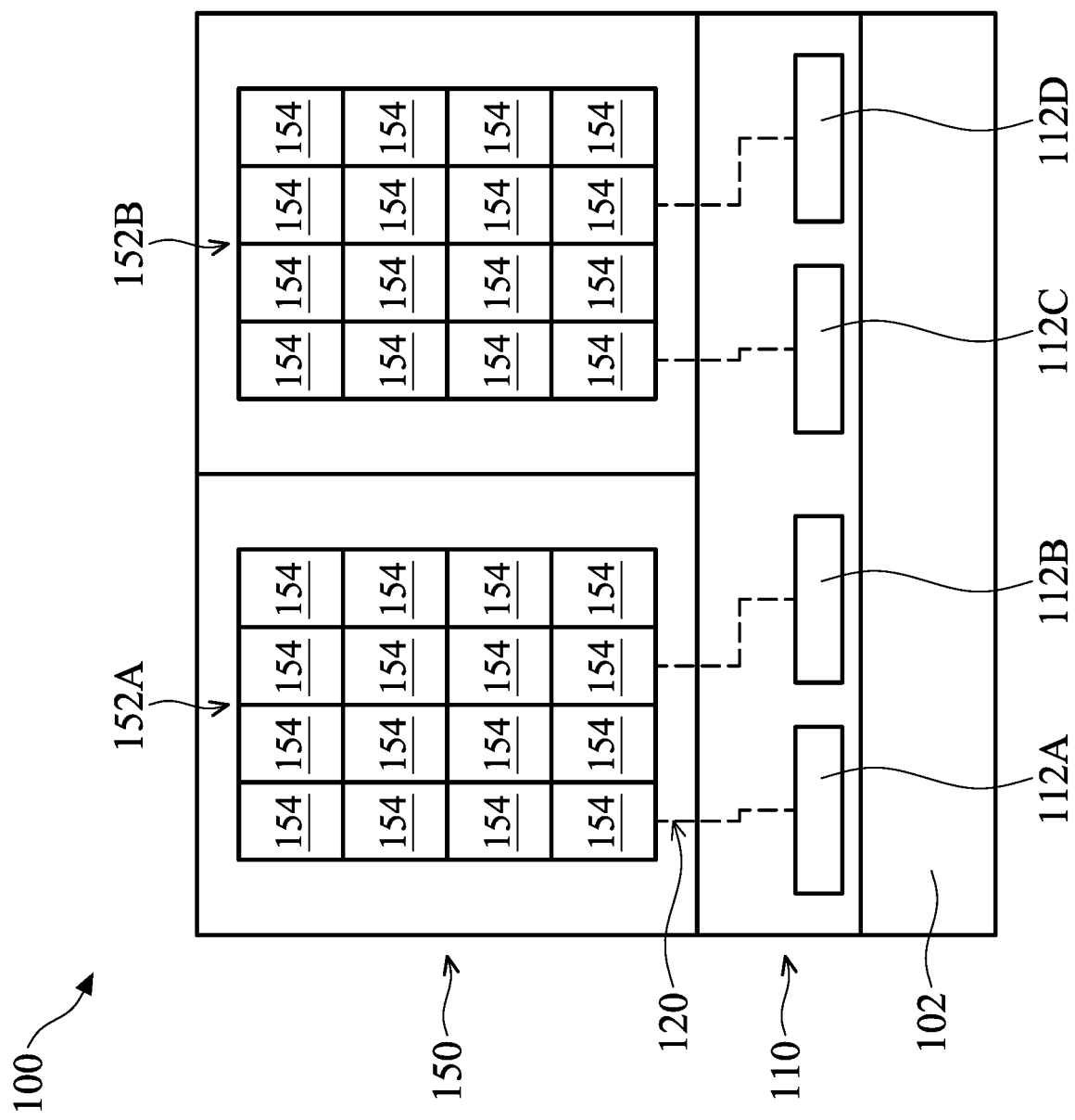
FIG. 1 is a schematic diagram of a semiconductor memory device including an array of memory cells, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Embodiments for forming a semiconductor memory device are provided. The method for forming the semiconductor memory device may include forming a sacrificial via in a dielectric layer over a substrate, forming a stack of layers for a memory cell array over the dielectric layer, forming a trench through the stack of layers and corresponding to the sacrificial via, removing the sacrificial via to form a via hole in the dielectric layer, and filling the trench and the via hole with a conductive material. As a result, the overlay window of via to access line may be improved, high aspect ratio etching may be avoided, and the risk of the damage of the storage layer of the semiconductor memory device may be prevented. Therefore, the production yield of the semiconductor memory device may be increased.

FIG. 1 is a schematic diagram of a semiconductor memory device 100 including an array of memory cells, in accordance with some embodiments of the disclosure. The semiconductor memory device 100 includes a substrate 102, a peripheral circuit region 110, and a memory cell array region 150, as shown in FIG. 1, in accordance with some embodiments. The peripheral circuit region 110 is formed vertically above the substrate 102, and the memory cell array region 150 is formed vertically above the peripheral circuit region 110, in accordance with some embodiments.

The peripheral circuit region 110 includes one or more peripheral circuits, e.g., logic circuits, which are illustrated for reference as logic devices 112A-D, in accordance with some embodiments. The peripheral circuits are configured for driving the devices of the memory cell array region 150, e.g., through an interconnect structure 120, in accordance with some embodiments. For example, the peripheral circuit region 110 may include various devices operable to access and/or control devices of the memory cell array region (e.g., to perform read/write/erase operations).

The devices of the peripheral circuit region 110 may include transistors, e.g., metal oxide semiconductor field effect transistors (MOSFET) such as p-channel and/or n-channel MOSFETs, complementary metal oxide semiconductor (CMOS) transistors, bipolar junction transistors (BJT), high-voltage transistors, high-frequency transistors, etc. The devices of the peripheral circuit region 110 may be configured as planar transistors or multi-gate transistors such as FinFET devices, gate-all-around (GAA) devices, etc.

The memory cell array region 150 includes a plurality of arrays of memory cells, which are illustrated for reference as memory cell array 152A and 152B, in accordance with some embodiments. Each of the memory cell arrays 152A and 152B includes a plurality of memory cells 154 operable for storage, in accordance with some embodiments. The memory cell arrays 152A and/or 152B include stackable memory cells 154, vertically arranged in an array format, in accordance with some embodiments. The memory cells 154 are arranged in a row/column configuration, in accordance with some embodiments. The memory cells 154 are flash memory transistors, e.g., with SONOS (silicon-oxide-nitride-oxide-silicon) structure, in accordance with some embodiments. In some embodiments, the memory cells are NOR-type flash memory cells.

The semiconductor memory device 100 is referred to as a peripheral circuit under memory array (PUA) device, in accordance with some embodiments. The PUA device configuration may provide an increase in memory cell density. For example, the increase may be evident in comparison to a configuration positioning a peripheral circuit region laterally adjacent (e.g., side-by-side) with the memory cell arrays. In contrast to the "side-by-side" configuration, the PUA device may allow the memory cells to be formed at least partially vertically above the peripheral circuitry.

Figure 2A:
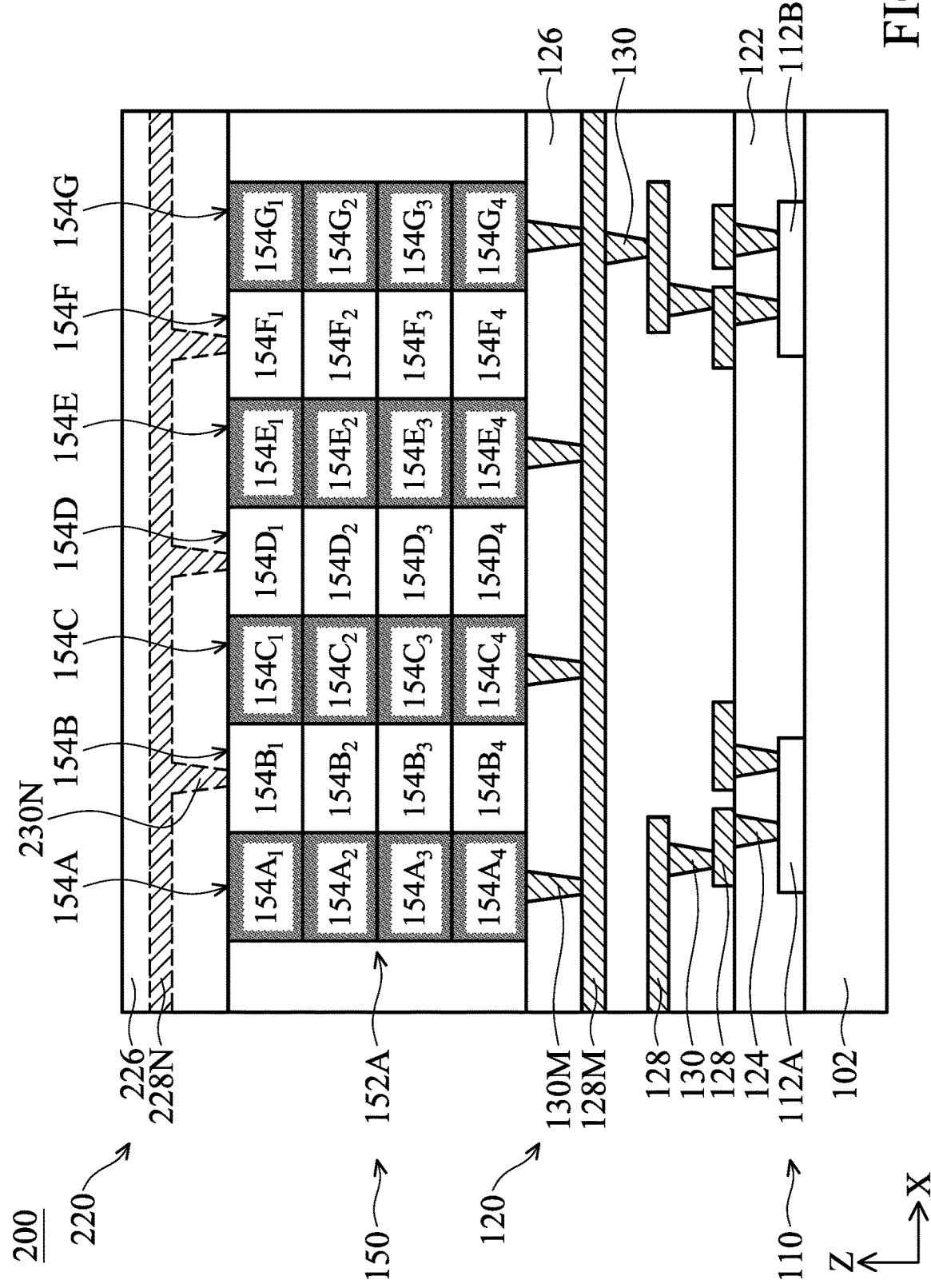
FIG. 2A is a cross-sectional view of a semiconductor memory device illustrating an interconnection from a peripheral circuit to an array of memory cells, in accordance with some embodiments of the disclosure.
Figure 2B:
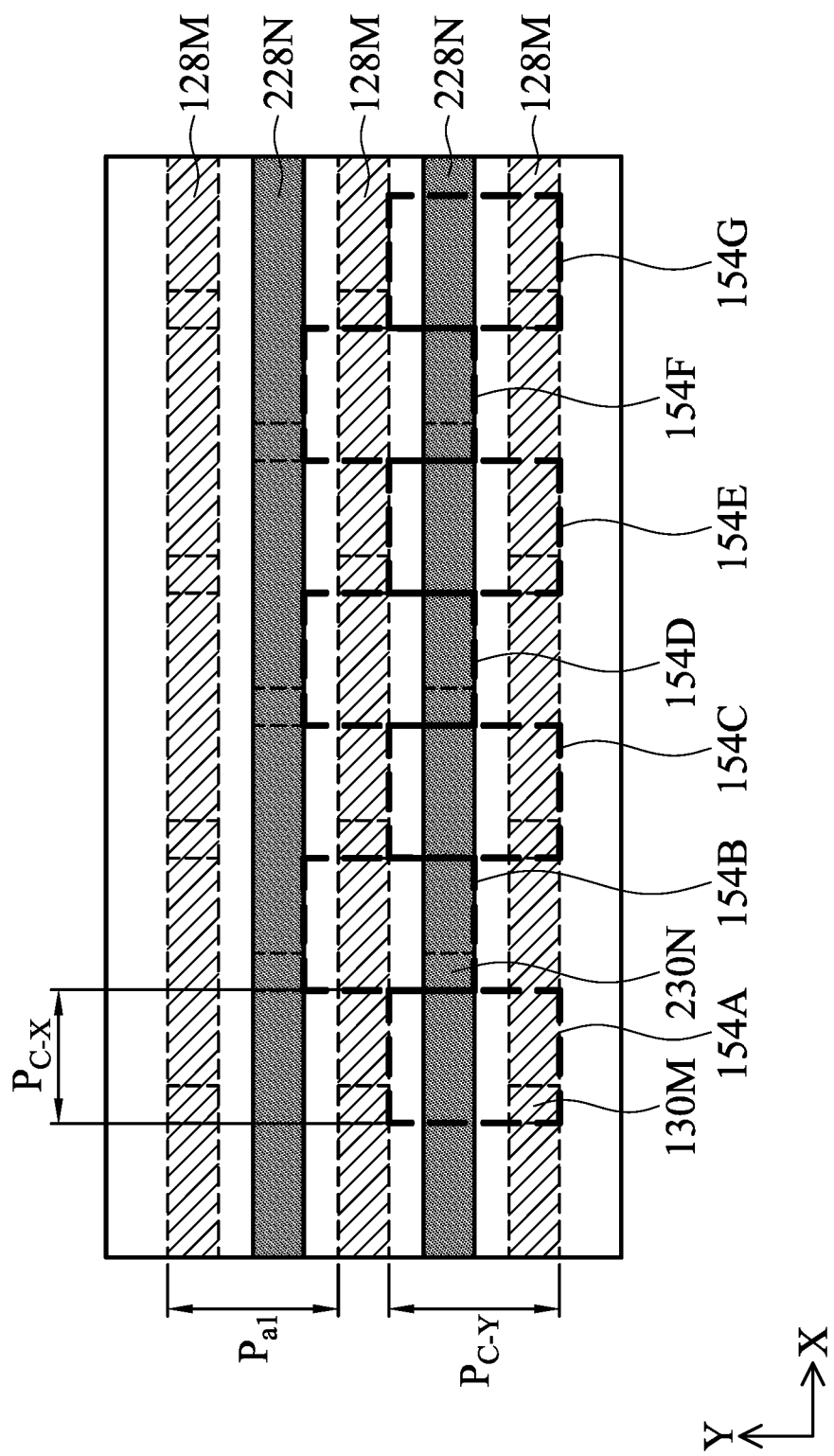
FIG. 2B is a layout of access lines of the semiconductor memory device of FIG. 2A, in accordance with some embodiments of the disclosure.

The design and implementation of the interconnect structure 120 between the memory cell array region 150 and the peripheral circuit region 110 in a peripheral circuit under array configuration however may be challenging. For example, the metal layer/via routing in the interconnect structure 120 between the memory cell array region 150 and the peripheral circuit region 110 must be addressed. FIGS. 2A and 2B provide an illustration of such a routing design, in accordance with some embodiments.

FIG. 2A is a cross-sectional view of a semiconductor memory device 200 illustrating an interconnect structure from a peripheral circuit to an array of memory cells, in accordance with some embodiments of the disclosure. FIG. 2B is a layout of access lines of the semiconductor memory device 200, in accordance with some embodiments of the disclosure.

The semiconductor memory device 200 is a PUA device, in accordance with some embodiments. The semiconductor memory device 200 includes a peripheral circuit region 110 formed on a substrate 102, a first (or lower) interconnect structure 120 vertically above the peripheral circuit region 110, and a memory cell array region 150 vertically above the first interconnect structure 120, as shown in FIG. 2A, in accordance with some embodiments.

The first interconnect structure 120 is a multi-layer interconnect (MLI) used to connect logic devices 112A and 112B of the peripheral circuit region 110 with one another, in accordance with some embodiments. The MLI of the first interconnect structure 120 is also used to connect the logic devices 112A and/or 112B of the peripheral circuit region 110 with devices of the memory cell array region 150 (e.g., memory cells 154 and components thereof), in accordance with some embodiments.

The MLI of the interconnect structure 120 includes a plurality of metal layers 128 (e.g., providing horizontal routing), and a plurality of contacts 124 and vias 130 (e.g., providing vertical routing), as shown in FIGS. 2A and 2B, in accordance with some embodiments. The contacts 124 are surrounded by an interlayer dielectric (ILD) layer 122 and land on the logic device 112A and 122B, in accordance with some embodiments. The metal layers 128 and the vias 130 are surrounded by an inter-metal dielectric (IMD) layer 126 and connected to the contacts 124, in accordance with some embodiments.

The uppermost or top metal layer 128 of the MLI includes a plurality of access lines 128M, as shown in FIGS. 2A and 2B, in accordance with some embodiments. The access lines 128M are planar with one another (e.g., at the same metallization level), in accordance with some embodiments. The access lines 128M are conductive lines operable to access the memory cells 154 of the memory cell array region 150, in accordance with some embodiments. The access lines 128M are access lines providing electrical connection to the memory cells 154 of the memory cell array region 150, in accordance with some embodiments. In some embodiments, the access lines 128M provide word lines (WL) for accessing the memory cells 154 of the memory cell array region 150. In some embodiments, the access lines 128M may provide bit lines (BL) for accessing the memory cells 154 of the memory cell array region 150.

The memory cell array region 150 includes array 152A which includes a plurality of memory cells 154, in accordance with some embodiments. The memory cells 154 are arranged in a row and/or column configuration, e.g., memory cell columns 154A-154G that together operate as a single memory cell array 152A, in accordance with some embodiments. Each of the memory cell columns 154A-154G are a vertically configured stack of multiple memory cells $154_{1-n}$, (e.g., $154A_1$-$154A_4$, $154B_1$-$154B_4$, etc.).

The access lines 128M provided by the first interconnect structure 120 are interconnected to a first grouping of the memory cells, which includes columns 154A, 154C, 154E, 154G, through the vias 130M, in accordance with some embodiments. That is, the access line 128M is interconnected to every other memory cell column of the array 152A, in accordance with some embodiments. Multiple memory cells $154_{1-4}$ of a single memory cell columns 154A, 154C, 154E, or 154G share a single vertically extending gate line (discussed below) that is connected to a single access line 128M through the via 130M, in accordance with some embodiments. FIG. 2B illustrates an interconnection of a single access line 128M to the corresponding first grouping of the memory cell columns, and one of ordinary skill may recognize interconnections of other access lines 128M to the corresponding first grouping of the memory cell columns.

A second (or upper) interconnect structure 220 is formed vertically above the memory cell array region 150, as shown in FIGS. 2A and 2B, in accordance with some embodiments. The second interconnect structure 220 include vias (e.g., providing vertical routing) and metal layers (e.g., providing horizontal routing), in accordance with some embodiments. The metal layers and vias are surrounded by an IMD layer 226, in accordance with some embodiments. It should be noted that the second interconnect structure 220 is connected the logic devices 112A and 112B of the peripheral circuit region 110, for example, through the first interconnect structure 120 in another region of the substrate 102 (not shown), in accordance with some embodiments.

The lowermost or bottom metal layers of the second interconnect structure 220 include a plurality of access lines 228N, as shown in FIGS. 2A and 2B, in accordance with some embodiments. The access lines 228N are planar with one another (e.g., at the same metallization level), in accordance with some embodiments. The access lines 228N are conductive lines operable to access memory cells 154 of the memory cell array region 150, in accordance with some embodiments. The access lines 228N are access lines providing electrical connection to the memory cells 154 of the memory cell array region 150, in accordance with some embodiments. In some embodiments, the access lines 228N provide word lines (WL) for accessing memory cells 154 of the memory cell array region 150. In some embodiments, the access lines 228N may provide bit lines (BL) for accessing memory cells 154 of the memory cell array region 150. In some embodiments, the access lines 128M and 228N provide the same functionality (e.g., both provide word lines). In some embodiments, the gate pick-up of the memory cells of the memory cell array is performed either by interconnection to one of the access lines 128M or the access lines 228N.

The access lines 228N provided by the second interconnect structure 220 are interconnected to a second grouping of the memory cells, which includes columns 154B, 154D, 154F, through the vias 230N, in accordance with some embodiments. That is, the access line 228N is interconnected to every other memory cell column of the array 152A, in accordance with some embodiments. Multiple memory cells $154_{1-4}$ of a single memory cell columns 154B, 154D, or 154F share a single vertically extending gate line (discussed below) that is connected to a single access line 228N through the via 230N, in accordance with some embodiments. FIG. 2B illustrates an interconnection of a single access line 228N to the corresponding second grouping of the memory cell columns, and one of ordinary skill may recognize interconnections of other access lines 228N to the corresponding second grouping of the memory cell columns.

In some embodiments, the memory cells 154 have a Y-pitch $P_{C-Y}$ (in the Y direction) and an X-pitch $P_{C-X}$ (in the X direction) between adjacent memory cells 154, as shown in FIG. 2B. In some embodiments, the Y-pitch $P_{C-Y}$ of the memory cells 154 is defined by the WL pitch, and the X-pitch $P_{C-X}$ of the memory cells 154 is defined by the BL pitch.

The routing illustrated in FIGS. 2A and 2B may be advantageous in that it can avoid having all interconnection of the access lines (e.g., gate pick-ups) through a top of the memory cell array, which would degrade memory cell scalability. Because half of the interconnections with the memory cells (e.g., gate pick-ups) being done at top region of the array (e.g., through access line 228N) and the other half of the interconnections with the memory cells (e.g., gate pick-ups) being done at a bottom region of the array (e.g., through access line 128M), the pitch required for interconnection of the access lines of the semiconductor memory device 200 may be relaxed, which may allow for improved scalability of the array.

The lower interconnect structure 120 or portions thereof between the peripheral circuit region 110 and the memory cell array region 150 are referred to as an interposer, in accordance with some embodiments. The interposer includes all or portions of, for example, the MLI of interconnect structure 120 such as vias 130M and/or the top metal layer 128 including access lines 128M, in accordance with some embodiments. Thus, various aspects of the present disclosure provide an interposer formation method before the memory cell array process to provide benefits, in some embodiments, one or more of (1) simplifying process integration flow, (2) relaxing interconnect (e.g., metal) pitch requirements, and/or (3) improving memory performance, (e.g., bandwidth (BW) of 3D flash memory).

FIGS. 3A-1, 3B-1, 3C, 3D-1, 3E-1, 3F-1, 3G-1, 3H-1, 3I-1, 3J-1, 3K, 3L-1, 3M-1, 3M-2, 3N-1, 3N-2, 3O-1, 3O-2, 3P-1, 3P-2, 3Q-1, 3Q-2, 3R-1, and 3R-2 are cross-sectional views of the formation of a semiconductor memory device 300 at various intermediate stages, in accordance with some embodiments of the disclosure. FIGS. 3A-2, 3B-2, 3D-2, 3F-2, 3G-2, 3H-2, 3I-2, 3J-2, 3L-2, 3M-3, 3N-3, 3O-3, 3P-3, 3Q-3 and 3R-3 are top views of the formation of the semiconductor memory device 300 at various intermediate stages, in accordance with some embodiments of the disclosure. FIGS. 3D-3, 3E-2, 3F-3, 3G-3, 3H-3, 3I-3, and 3J-3 are enlarged views of area A shown in FIGS. 3D-1, 3E-1, 3F-1, 3G-1, 3H-1, 3I-1, and 3J-1, in accordance with some embodiments of the disclosure.

Furthermore, FIGS. 3A-1, 3B-1, 3C, 3D-1, 3E-1, 3F-1, 3G-1, 3H-1, 3I-1, 3J-1, 3K, 3L-1, 3M-1, 3N-1, 3O-1, 3P-1, 3Q-1, and 3R-1 are cross-sectional views taken along line I-I of FIGS. 3A-2, 3B-2, 3D-2, 3F-2, 3G-2, 3H-2, 3I-2, 3J-2, 3L-2, 3M-3, 3N-3, 3O-3, 3P-3, 3Q-3 and 3R-3, in accordance with some embodiments of the disclosure. FIGS. 3M-2, 3N-2, 3O-2, 3P-2, 3Q-2, and 3R-2 are cross-sectional views taken along line II-II of FIGS. 3M-3, 3N-3, 3O-3, 3P-3, 3Q-3 and 3R-3, in accordance with some embodiments of the disclosure.

Figures 1, 2, 3A:
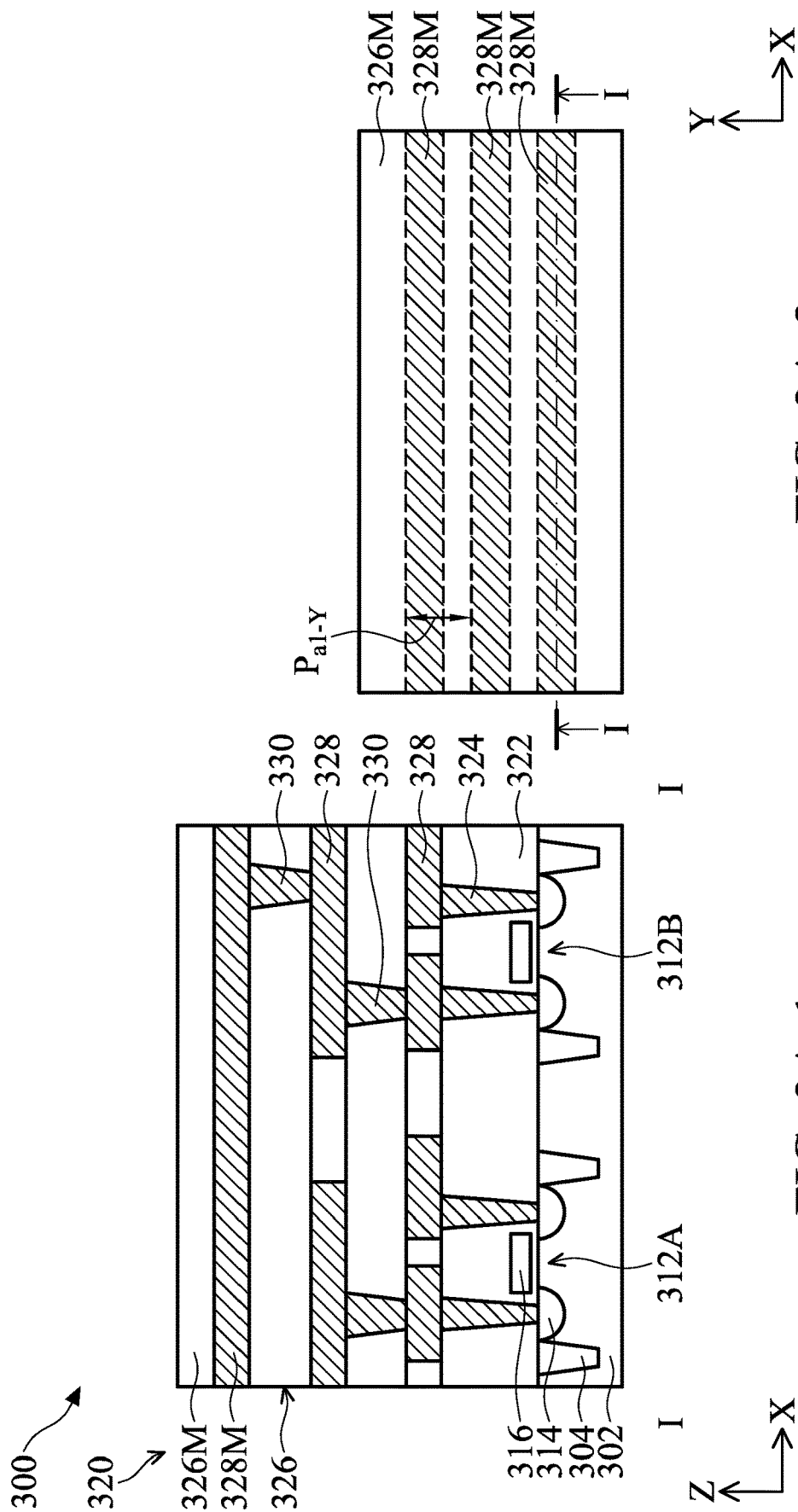

A substrate 302 is provided, as shown in FIG. 3A-1, in accordance with some embodiments. In some embodiments, the substrate 302 is a semiconductor substrate such as a silicon substrate. In some embodiments, the substrate 302 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 302 may optionally include an epitaxial layer (epi-layer), may be strained for performance enhancement, may include a silicon-on-insulator (SOI) structure, and/or have other suitable enhancement features.

An isolation structure 304 is formed in the substrate 302 to define active regions of the substrate 302, as shown in FIG. 3A-1, in accordance with some embodiments. In some embodiments, the isolation structure 304 is made of one or more dielectric materials, such as silicon oxide, silicon nitride, silicon oxynitride (SiON), another suitable dielectric material, and/or a combination thereof. In some embodiments, the steps of forming the isolation structure 304 include recessing the substrate 302 to form trenches, depositing one or more dielectric materials in the trenches and over the upper surface of the substrate 302, and planarizing the one or more dielectric materials over the upper surface of the substrate 302 using, for example, chemical mechanical polishing (CMP). The deposition may be chemical vapor deposition (CVD) (such as low pressure CVD (LPCVD), plasma enhanced CVD (PECVD), high density plasma CVD (HDP-CVD), high aspect ratio process (HARP), and flowable CVD (FCVD)), atomic layer deposition (ALD), spin-on coating, another suitable method, or a combination thereof.

Logic devices 312A and 312B are formed on the substrate 302 in the active regions, as shown in FIG. 3A-1, in accordance with some embodiments. The logic devices 312A and 312B are components of the peripheral circuit region (discussed above respect with to FIGS. 1 and 2A), in accordance with some embodiments. The peripheral circuit components may make up a control circuit for operating an array of memory cells formed vertically above. The peripheral circuit components may include, but is not limited to, voltage boost circuitry, page buffer circuitry, column decoder, row decoder, error correction circuitry, write assist circuitry, interface circuitry including for interfacing between types of memory cells, bus control circuitry, and the like.

The logic devices are MOSFETs, in accordance with some embodiments. The MOS transistors may be p-type MOSFETs (P-MOSFET) or n-type MOSFETs (N-MOSFET). The MOSFET may be planar-type transistors, fin-type transistors (e.g., FinFETs), and/or other transistor configurations including as discussed above in FIG. 1. In some embodiments, the logic devices 312A and 312B are planar-type transistors. The logic devices 312A and 312B each include a gate structure 316 and source/drain regions 314, in accordance with some embodiments. The gate structure 316 is formed over the upper surface of the substrate 302, in accordance with some embodiments. The source/drain regions 314 are formed in or embedded at least partially in the substrate 302 on opposite sides of the gate structure 316, in accordance with some embodiments.

In some embodiments, the gate structure 316 includes a gate dielectric layer and a gate electrode layer over the gate dielectric layer. In some embodiments, the gate dielectric layer includes an interfacial layer of dielectric material such as silicon oxide ($SiO_2$), HfSiO, or silicon oxynitride (SiON). The interfacial layer may be formed using chemical oxidation, thermal oxidation, ALD, CVD, and/or another suitable method. In some embodiments, the gate dielectric layer includes high-K gate dielectric layer of high-K dielectric materials such as hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or another suitable material. The high-K gate dielectric layer may be formed by ALD, physical vapor deposition (PVD), CVD, thermal oxidation, and/or another suitable method.

In some embodiments, the gate electrode layer includes a conductive material, such as doped semiconductor, a metal, metal alloy, or metal silicide. In some embodiments, the gate electrode layer includes a single layer or alternatively a multi-layer structure, such as various combinations of a metal layer with a selected work function to enhance the device performance (work function metal layer), a liner layer, a wetting layer, an adhesion layer, a metal fill layer, and/or another suitable layer. The gate electrode layer may be formed of polysilicon, germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer may be formed by ALD, PVD, CVD, e-beam evaporation, or another suitable process. Furthermore, the gate structures 316 may be formed separately for N-FET and P-FET transistors which may use different gate electrode layers.

In some embodiments, the source/drain regions 314 are regions of the substrate 302 suitably doped using an implantation process. In some embodiments, the source/drain regions 314 are epitaxially grown source/drain regions using an epitaxial growth process.

A multi-layer interconnect structure 320 is formed over the substrate 302, as shown in FIG. 3A-1, in accordance with some embodiments. The interconnect structure 320 is formed over and coupled to the logic devices 312A and 312B, in accordance with some embodiments. The interconnect structure 320 includes contacts 322 in an ILD layer 324, and metal layers 328 and conductive vias 330 in multiple IMD layers 326, as shown in FIG. 3A-1, in accordance with some embodiments. The interconnect structure 320 serves to interconnect devices (e.g., logic devices) of the peripheral circuit, in accordance with some embodiments. The interconnect structure 320 serves to interconnect the underlying peripheral circuit with an overlying memory cell array, in accordance with some embodiments. As such, portions of the interconnect structure 320 may be referred to as providing an interposer.

The ILD layer 322 is formed over the upper surface of the substrate 302 and covers the logic devices 312A and 312B, in accordance with some embodiments. In some embodiments, the ILD layer 322 is made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the ILD layer 322 is formed using CVD (such as HDP-CVD, PECVD, or HARP), ALD, another suitable method, and/or a combination thereof.

The contacts 324 are formed through ILD layer 322 and land on the source/drain regions 314 of the logic device 312A and 312B, in accordance with some embodiments. In some embodiments, the contacts 324 land on the gate structure 316 (not shown). In some embodiments, the contacts 324 are made of a one or more conductive materials, for example, cobalt (Co), nickel (Ni), tungsten (W), titanium (Ti), tantalum (Ta), cupper (Cu), aluminum (Al), ruthenium (Ru), molybdenum (Mo), TiN, TaN, and/or a combination thereof. In some embodiments, the contacts 324 include a silicide layer, such as WSi, NiSi, TiSi or CoSi, formed on the source/drain regions 314. In some embodiments, the formation of the contacts 324 includes patterning the ILD layer 322 to form contact openings through the ILD layer 322 and exposing the source/drain regions 314. In some embodiments, the conductive material for the contacts fills the contact openings and is formed over the upper surface of the ILD layer 322. In some embodiments, a planarization process such as CMP is performed on the conductive material until the upper surface of the ILD layer 322 is exposed.

The multiple IMD layers 326 are formed over the ILD layer 322, in accordance with some embodiments. In some embodiments, each of the IMD layers 326 is made of one or more dielectric materials, such as silicon oxide ($SiO_2$), silicon nitride (SiN), silicon oxynitride (SiON), silicon carbon nitride (SiCN), oxygen-doped silicon carbide (SiC:O), oxygen-doped silicon carbon nitride (SiCN:O), silicon oxycarbide (SiOC), tetraethylorthosilicate (TEOS) oxide, undoped silicate glass (USG), borophosphosilicate glass (BPSG), fluoride-doped silicate glass (FSG), phosphosilicate glass (PSG), borosilicate glass (BSG), organosilicate glasses (OSG), Spin-On-Glass, Spin-On-Polymers, silicon carbon material, or a combination thereof. In some embodiments, the IMD layers 326 are formed using CVD (such as LPCVD, PECVD, HDP-CVD, HARP, and FCVD), ALD, spin-on coating, another suitable method, or a combination thereof.

The metal layers 328 and the vias 330 are formed in the IMD layers 326, in accordance with some embodiments. The metal layers 328 provide a horizontal routing for a signal or signals produced by the peripheral circuit component (e.g., logic devices 312A and 312B), in accordance with some embodiments. The vias 330 provide a vertical routing for a signal or signals produced by the peripheral circuit component (e.g., logic devices 312A and 312B), in accordance with some embodiments.

In some embodiments, the metal layers 328 and the vias 330 are made of copper (Cu), cobalt (Co), ruthenium (Ru), molybdenum (Mo), tungsten (W), titanium (Ti), another suitable conductive material, an alloy thereof, nitrides of these materials, multilayers thereof, and/or a combination thereof. In some embodiments, the metal layers 328 and the vias 330 are formed using damascene processes (e.g., single damascene or dual damascene), for example, forming openings for the vias 330 and trenches for the metal layers 328 in the IMD layers 326, and forming conductive material in the openings and the trenches using such as an electroplating (ECP) process or an electroless depositing (ELD) process.

The uppermost or top metal layer 328 formed provides a plurality of access lines 328M (or referred to bottom access lines 328M), as shown in FIGS. 3A-1 and 3A-2, in accordance with some embodiments. An uppermost or top IMD layer 326M is formed over the access lines 328M, in accordance with some embodiments. The access lines 328M extend in the X direction, in accordance with some embodiments. The access lines 328M are arranged in the Y direction and spaced from one another, in accordance with some embodiments. The access lines 328M are conductive lines operable to access and/or control one or more memory cells of the memory cell array, in accordance with some embodiments. In some embodiments, the access lines 328M are word lines (WL) and have a pitch $P_{a1-Y}$ in the Y direction between adjacent word lines. In some embodiments, the access lines 328M are bit lines (BL). It should be noted that whether the access lines 328M are word lines or bit lines is dependent on the desired configuration of the memory cells, where the functionality of the other one of the word line or bit line is provided, for example, within the subsequently formed stack of active layers.

Sacrificial vias 332 are formed in the IMD layer 326M, as shown in FIGS. 3B-1 and 3B-2, in accordance with some embodiments. The sacrificial vias 332 lands on the access lines 328M, in accordance with some embodiments. The sacrificial vias 332 are aligned over each access line 328M, in accordance with some embodiments. As such, in some embodiments, the sacrificial vias 332 have a Y-pitch $P_{V1-Y}$ (in the Y direction) between adjacent sacrificial vias 332 that is substantially equal to pitch $P_{a1-Y}$ of the access lines 328M. In some embodiments, the sacrificial vias 332 have an X-pitch $P_{V1-X}$ (in the X direction) between adjacent sacrificial vias 332. In some embodiments, the X-pitch $P_{V1-X}$ of the sacrificial vias 332 is twice the pitch of the bit lines (discussed below). This relaxed X-pitch $P_{V1-X}$ is due to half of the memory cells being configured to connect to the access line 328M under the memory cell array, and half of the memory cells being configured to connect to the metal access line above the memory cell array (discussed below).

In some embodiments, the sacrificial vias 332 have a dimension L measured in the X direction and a dimension W measured in the Y direction. The dimension L and the dimension W may be substantially similar. In some embodiments, the dimension L is 0.2 to 0.8 the pitch of bit lines (discussed below). In some embodiments, the dimension W of about 0.2 to about 0.8 the pitch of the word lines (e.g., the pitch $P_{a1-Y}$ of the access lines 328M). In some embodiments, the sacrificial vias 332 have a thickness ranging from about 30 nm to about 200 nm.

The sacrificial vias 332 are made of a dielectric material having a different etching selectivity from adjacent dielectric materials (e.g., uppermost IMD layer 326M), in accordance with some embodiments. In some embodiments, the sacrificial vias 332 are formed of silicon nitride, silicon oxide, and silicon oxynitride. The sacrificial vias 332 may be referred to as a dielectric interposer.

In some embodiments, the steps of forming the sacrificial vias 332 include forming a patterned mask layer (not shown) on the IMD layer 326M, and etching the IMD layer 326M uncovered by the patterned mask layer. For example, a photoresist may be formed on the IMD layer 326M, such as by using spin-on coating, and patterned with a pattern corresponding to the sacrificial vias 332 by exposing the photoresist to light using an appropriate photomask. Exposed or unexposed portions of the photo resist may be removed depending on whether a positive or negative resist is used. The pattern of the photoresist may then be transferred to the IMD layer 326M to form via holes (not shown), such as by using one or more suitable etch processes. The photoresist may be removed in an ashing or wet strip process, for example. The etch processes may include a reactive ion etch (RIE), neutral beam etch (NBE), inductive coupled plasma (ICP) etch, the like, or a combination thereof. The etch processes may be anisotropic. The etch processes may be performed until the access lines 328M are exposed.

In some embodiments, afterward, the via holes are filled with a dielectric material to form sacrificial vias 332 in the IMD layer 326M. The dielectric material may also be formed over the IMD layer 326M. In some embodiments, the dielectric material over the upper surface of the IMD layer 326M is removed using a planarization process such as CMP or etching-back until the upper surface of the IMD layer 326M is exposed.

An etching stop layer (ESL) 329 is formed over the upper surface of the uppermost IMD layer 326M, as shown in FIGS. 3B-1 and 3B-2, in accordance with some embodiments. The etching stop layer 329 covers the sacrificial vias 332, in accordance with some embodiments. The etching stop layer 329 interfaces each of the sacrificial vias 332 and the adjacent IMD layer 326M. Generally, an ESL may provide a mechanism to stop or slow down an etching process when forming, e.g., openings, holes, trenches, etc. The ESL may be formed of a dielectric material having a different etching selectivity from adjacent layers or components.

In some embodiments, the etching stop layer 329 is made of a dielectric layer, such as AlO, AlN, SiOC, or a combination thereof. In some embodiments, the etching stop layer 329 is formed using CVD (such as LPCVD, PECVD, HDP-CVD, HARP, and FCVD), ALD, another suitable method, or a combination thereof.

In some embodiments, the etching stop layer 329 has a thickness ranging from about 10 nm to about 200 nm. The thickness of the etching stop layer 329 may be determined by the number of memory cells vertically stacked above the etching stop layer 329. For example, the more memory cells that are provided vertically above the etching stop layer 329 the greater the thickness desired for the etching stop layer 329.

Figure 3C:
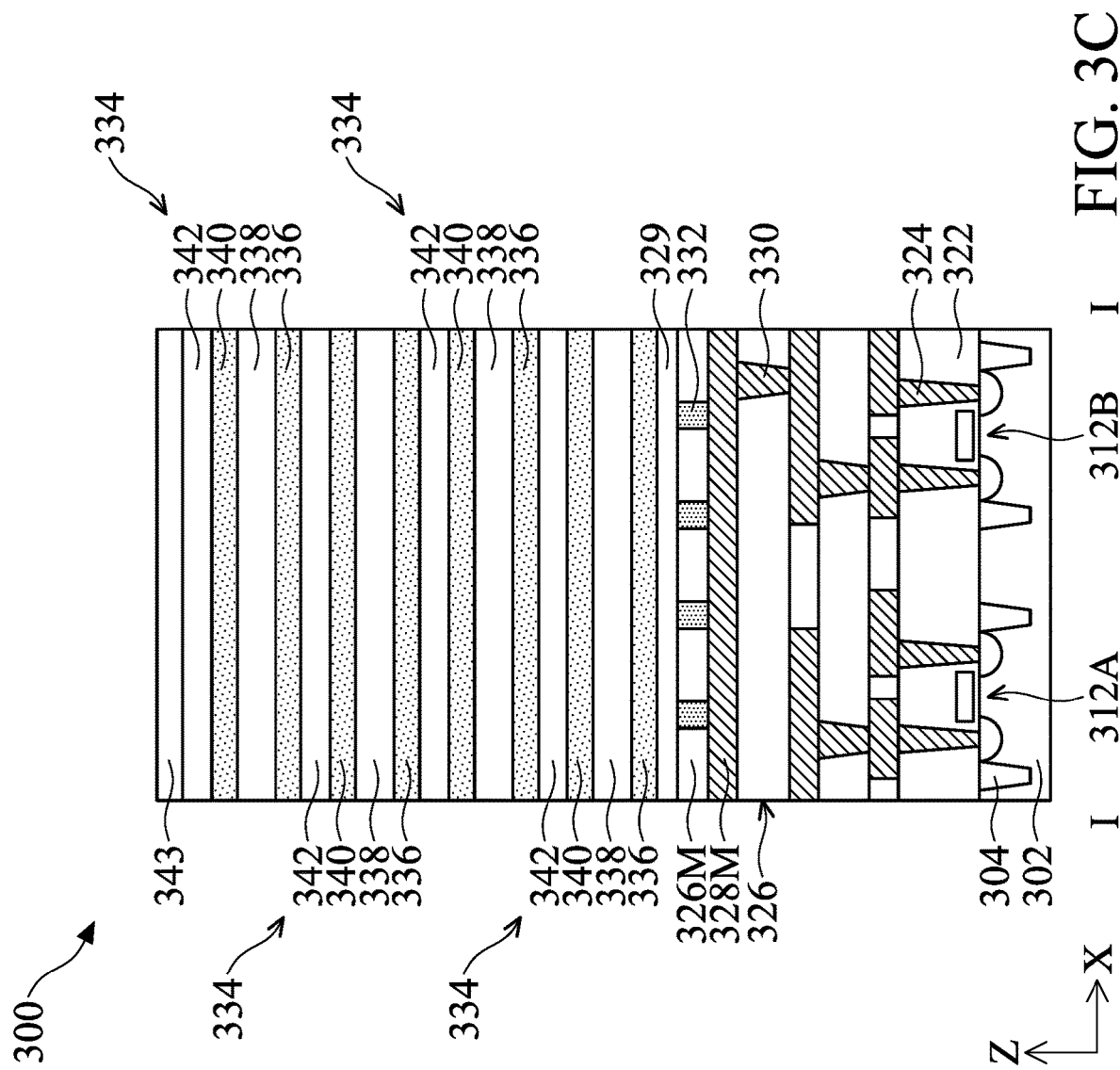

A plurality of stacks of layers 334 is formed over the etching stop layer 329, as shown in FIG. 3C, in accordance with some embodiments. The stacks 334 are used to form one or more memory cell arrays, in accordance with some embodiments. Each of the stacks 334 includes, in order, from bottom to top, an active layer 336, an insulating layer 338, an active layer 340, and an insulating layer 342, in accordance with some embodiments. The stacks 334 may be repeated any number of times such as 2, 4, 6, 8, 16, 24, 32, or more, that is dependent upon the desired array size. FIG. 3 illustrates 4 cycles of the stacks 334, in accordance with some embodiments.

The active layers 336 and 340 interposed by the insulating layer 338 are material layers used to form source/drain features of vertical-type memory transistors (e.g., channel current flows in the Z direction), in accordance with some embodiments. The insulating layer 342, the uppermost layer of a single stack 334, is used to isolate the underlying memory transistors from the overlying memory transistors, which are formed from the stack 334 of the next cycle, in accordance with some embodiments.

In some embodiments, the active layers 336 and 340 are made of semiconductor material, such as silicon (e.g., polysilicon), germanium (e.g., poly-germanium), or another suitable semiconductor material. The active layers 336 and 340 are formed using epitaxial growth process, CVD, ALD, or another suitable deposition technique. In some embodiments, the active layers 336 and 340 are doped, e.g., with an n-type or a p-type dopant.

The insulating layer 338 is formed interposing the active layers 336 and 340, in accordance with some embodiments. In some embodiments, the insulating layer 338 is made of an oxide (e.g., silicon oxide). In some embodiments, the insulating layer 338 is formed using CVD (such as PECVD), ALD, another suitable method, or a combination thereof. In some embodiments, the insulating layer 342 is made of a different material than the insulating layer 338, for example, a nitride (e.g., silicon nitride). In some embodiments, the insulating layer 342 is formed using CVD (such as PECVD), ALD, another suitable method, or a combination thereof.

A capping layer 343 is formed over the upper surface of the uppermost stack 334, as shown in FIG. 3C, in accordance with some embodiments. The capping layer 343 is used to protect the stacks 334 in the following etching processes, in accordance with some embodiments. In some embodiments, the capping layer 343 is made of an oxide (e.g., silicon oxide). In some embodiments, the capping layer 343 is formed using CVD (such as PECVD), ALD, another suitable method, or a combination thereof.

A plurality of trenches 344 is formed through the capping layer 343 and the plurality of stacks 334, as shown in FIGS. 3D-1, 3D-2, and 3D-3, in accordance with some embodiments. The trenches 344 penetrate through each layer of the stacks 334 and expose portions of the upper surface of the etching stop layer 329, in accordance with some embodiments. The trenches 344 extend in the Y direction, in accordance with some embodiments. The trenches 344 are arranged in the X direction and spaced from one other, in accordance with some embodiments. Every other trench 344 corresponds to and is aligned with the sacrificial vias 344 arranged in the Y direction, in accordance with some embodiments. The trenches 344 define regions for gate structures (or gate lines) to be formed. In some embodiments, the trenches 344 are formed using a patterning process including a photolithography process followed by an etching process (e.g., dry etching).

Furthermore, the plurality of stacks 334 cut by the trenches 344 forms a plurality of source/drain features 335, 337, 339, 341, as shown in FIG. 3D-3, in accordance with some embodiments. The source/drain feature 335 and the source/drain feature 339 are formed at a first, or left, side of a single trench 334 and interposed by the insulating layer 338, in accordance with some embodiments. The source/drain feature 337 and the source/drain feature 342 are formed at a second, or right, side of a single trench 334 and interposed by the insulating layer 338, in accordance with some embodiments. In some embodiments, the source/drain features 335 and 337 are source features of memory transistors, and the source/drain features 339 and 341 are drain features of memory transistors.

In some embodiments, the source/drain features 335 and 337 provide source lines. In some embodiments, the source/drain features 339 and 341 provide bit lines (BL) which have a pitch $P_{a2-X}$ in the X direction between adjacent bit lines. As discussed above, in some embodiments, the dimension L of the sacrificial via 332 (see FIG. 3B-2) is about 0.2 to about 0.8 the pitch of bit lines (e.g., the pitch $P_{a2-X}$). Furthermore, the X-pitch $P_{\nu1-X}$ of the sacrificial vias 332 (see FIG. 3B-2) is twice the BL pitch $P_{a2-X}$ (e.g., the sacrificial via 332 being disposed directly below every other trench 344).

In some embodiments, the source/drain features 339 and 341 provide word lines (WL). It should be noted that whether the source/drain features 339 and 341 are bit lines or word lines is dependent on the desired configuration of the memory cells, where the functionality of the other one of the word lines or the bit lines are provided, for example, by the access lines 328M, routed on the top metal layer 328.

After the trenches 344 are formed, the memory cells C are defined, in accordance with some embodiments. In some embodiments, the memory cells C have a Y-pitch $P_{C-Y}$ (in the Y-direction) and an X-pitch $P_{C-X}$ (in the Z-direction) between horizontally adjacent memory cells C. In some embodiments where the access lines 328M provide word lines and the source/drain features 339 and 341 provides bit lines, the Y-pitch $P_{C-Y}$ is equal to the WL pitch $P_{a1-Y}$ and an X-pitch $P_{C-X}$ is equal to the BL pitch $P_{a2-X}$. One of ordinary skill may recognize that the memory cells C have a Z-pitch between vertically adjacent memory cells C and the Z-pitch is defined by the stacks 334. In some embodiments, a single memory cell C includes two opposite memory transistors sharing a common gate line (discussed below).

Figures 1, 2, 3E:
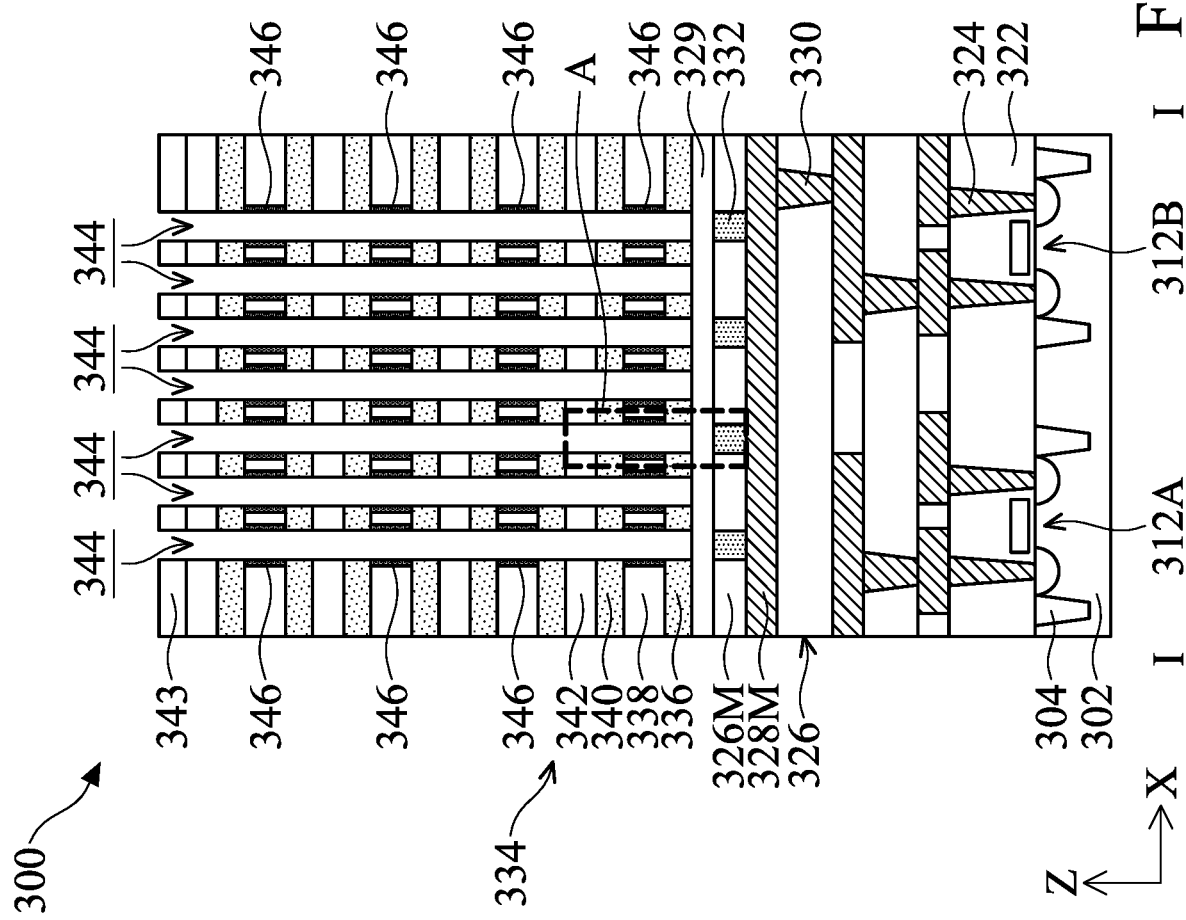
Figures 2, 3F:
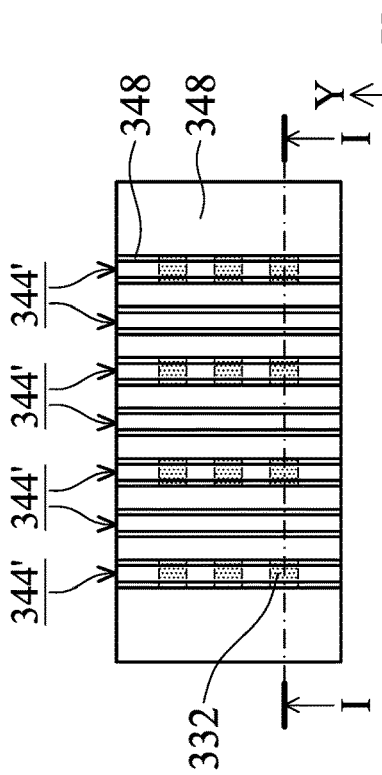
Figures 3, 3F:
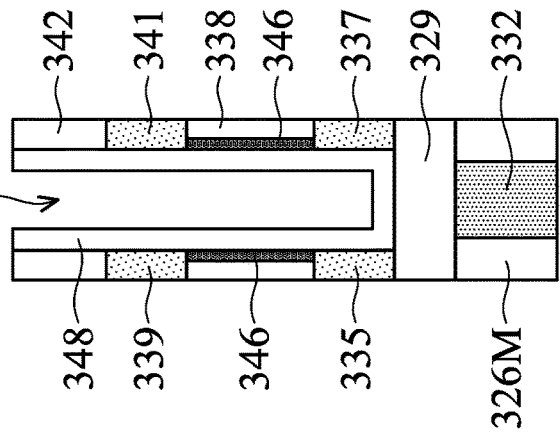
Figures 1, 3F:
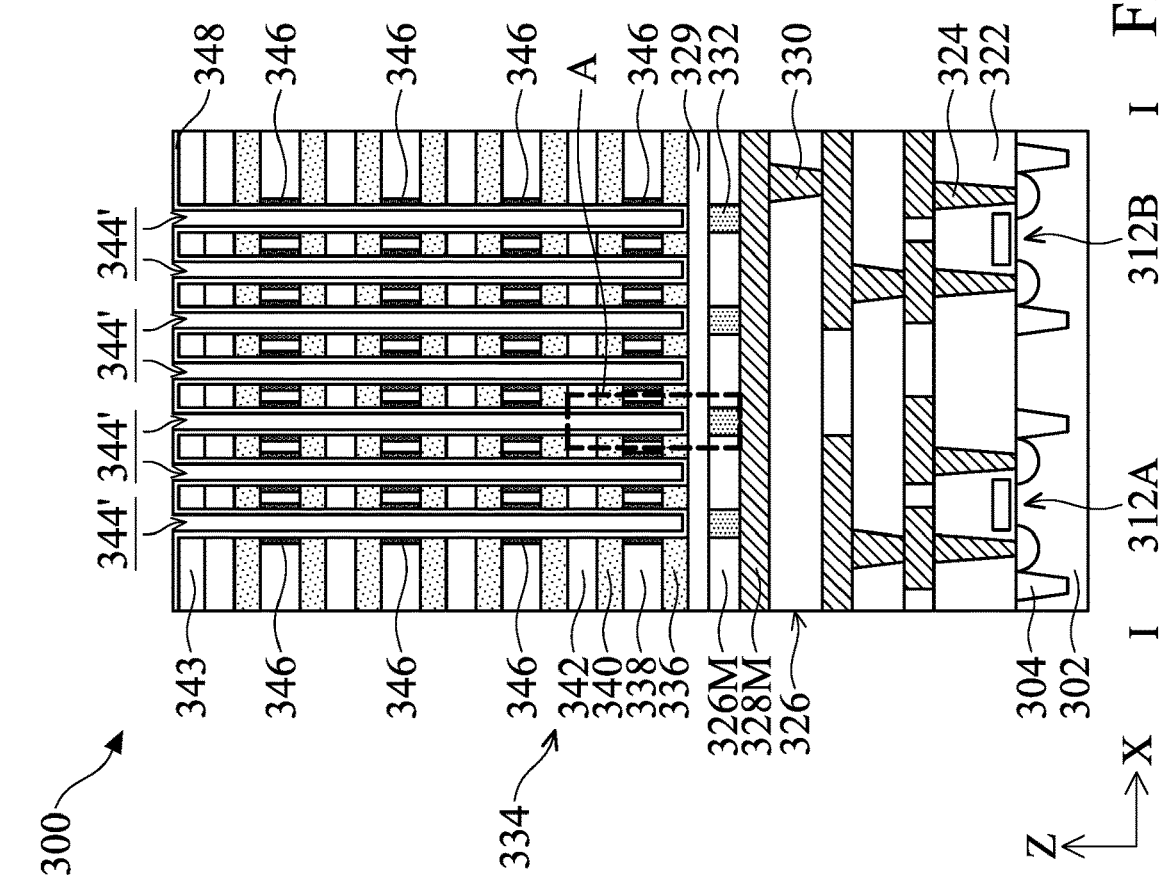
Figures 2, 3J:
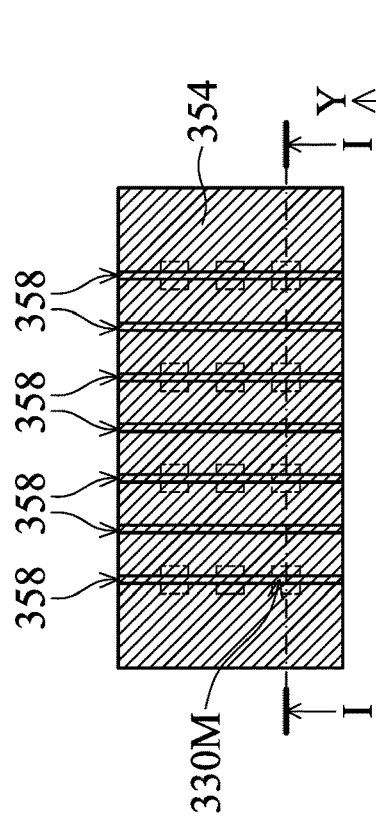
Figures 3, 3J:
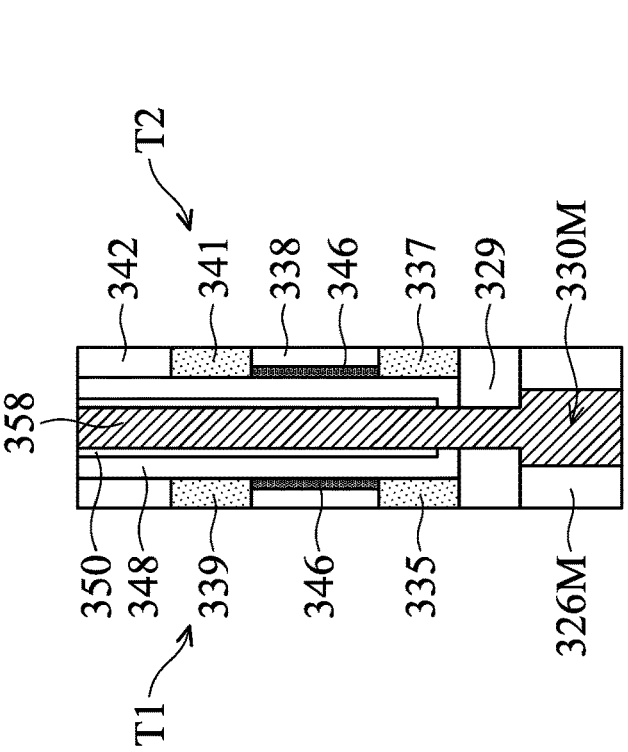
Figures 1, 3J:
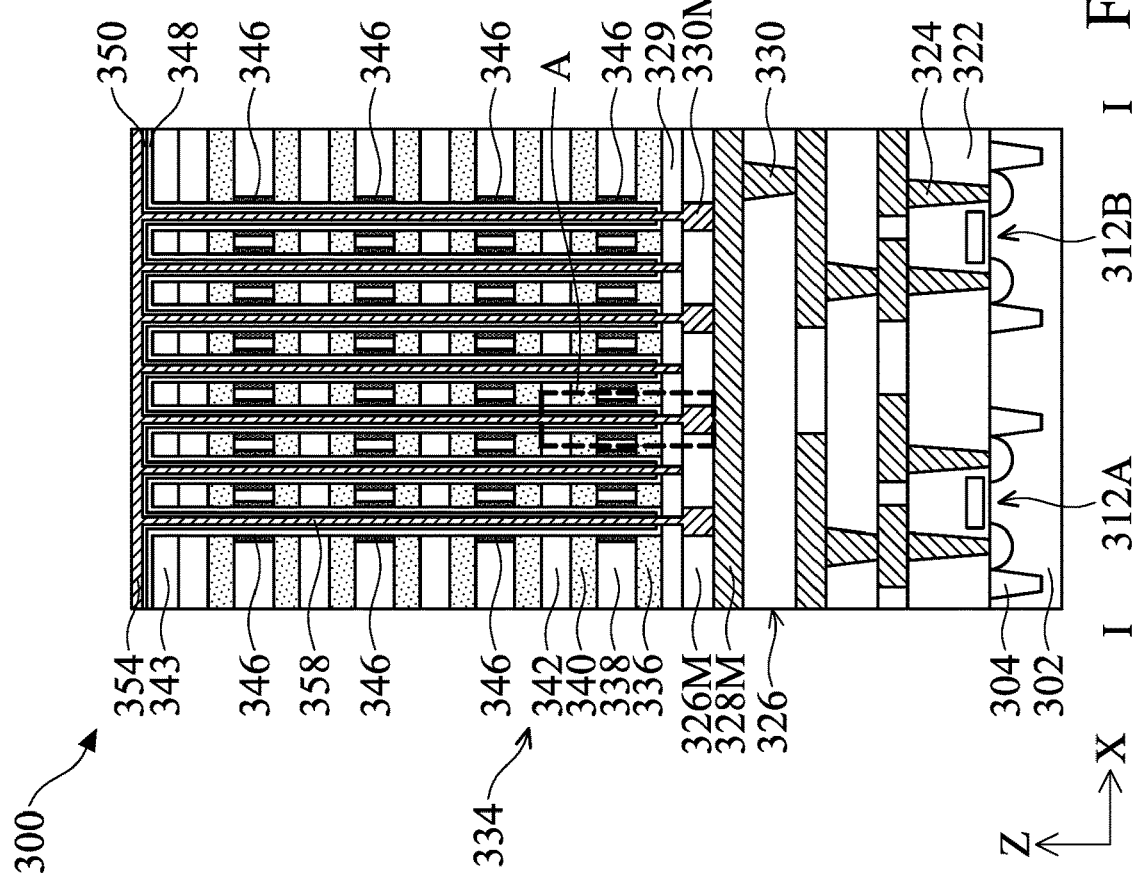

Channel features 346 are formed on the sidewalls of the insulating layers 338 exposed from the trenches 344, as shown in FIGS. 3E-1 and 3E-2, in accordance with some embodiments. The channel features 346 are formed between the source/drain features 335 and 339 and the source/drain features 337 and 341, in accordance with some embodiments. The channel features 346 are used as the channel regions of memory transistors, in accordance with some embodiments.

In some embodiments, the channel features 346 are made of semiconductor material, such as silicon (e.g., polysilicon), germanium (e.g., poly-germanium), or another suitable semiconductor material. The semiconductor material may be doped, e.g., with an n-type or a p-type dopant. In some embodiments, the steps of forming the channel features 346 include laterally recessing the insulating layers 338 using etching process, conformally depositing a semiconductor material for channel features 346 to fill the recess. The semiconductor material may also be formed on the respective exposed sidewalls of the source/drain features 335, 337, 339, 341 and the insulating layer 342. Afterward, the semiconductor material formed on the exposed sidewalls of the source/drain features 335, 337, 339, 341 and the insulating layer 342 is etched away thereby leaving portions of the semiconductor material in the recesses as the channel features 346.

A storage layer 348 is formed over the semiconductor memory device 300, as shown in FIGS. 3F-1, 3F-2, and 3F-3, in accordance with some embodiments. The storage layer 348 functions to trap charges where the current differences detected in the cell (e.g., drain current) provide the memory effect, in accordance with some embodiments. The storage layer 348 is conformally formed along the sidewalls (e.g, respective sidewalls of the source/drain features 335, 337, 339, 341, the channel feature 346, and the insulating layer 342 exposed from the trenches 344) and the bottom surfaces (e.g., the upper surface of the etching stop layer 329 exposed from the trenches 344) of the trenches 344, in accordance with some embodiments. The storage layer 348 is also formed along the upper surface of the capping layer 343, in accordance with some embodiments. After forming the storage layer 348, the remaining portions of the trenches 344 are denoted as trenches 344', in accordance with some embodiments.

In some embodiments, the storage layer 348 is an ONO storage layer. In some embodiments, the ONO storage layer includes an oxide-nitride-oxide configuration such as $SiO_2$—SiN—$SiO_2$. In some embodiments, the storage layer 348 is formed using CVD (such as LPCVD, PECVD, HDP-CVD, HARP, and FCVD), ALD, another suitable method, or a combination thereof.

A spacer layer 350 is formed over the semiconductor memory device 300, as shown in FIGS. 3G-1, 3G-2, and 3G-3, in accordance with some embodiments. The spacer layer 350 is conformally formed along the storage layer 348, in accordance with some embodiments. The spacer layer 350 is used to protect the storage layer 348 during a subsequent etching process, in accordance with some embodiments. After forming the spacer layer 350, the remaining portions of the trenches 344' are denoted as trenches 344", in accordance with some embodiments.

In some embodiments, the spacer layer 350 is made of a conductive material, such as semiconductor material (such as polysilicon or poly-germanium), TiN, W, Co, or another suitable conductive material. In some embodiments, the semiconductor material is doped, e.g., with an n-type or a p-type dopant. In some embodiments, the spacer layer 350 is formed using CVD, PVD ALD, e-beam evaporation, or another suitable process. In some embodiments, after the material for the spacer layer 350 is formed, an etching-back process is performed to remove the material for the spacer layer 350 formed above the upper surface of the capping layer 343.

The bottoms of the trenches 344" are opened using an etching process, in accordance with some embodiments. The trenches 344" are extended from the bottoms of the trenches 344" into and through the spacer layer 350, the storage layer 348, and the etching stop layer 329, as shown in FIGS. 3H-1, 3H-2, and 3H-3, in accordance with some embodiments. The enlarged trenches 344" are denoted as trenches 345, in accordance with some embodiments. The trenches 345 that are aligned with the sacrificial vias 332 exposes the upper surfaces of the sacrificial vias 332, in accordance with some embodiments. The trenches 345 that are not aligned with the sacrificial vias 332 expose the upper surface of the IMD layer 326M, or alternatively extend into the IMD layer 326M, in accordance with some embodiments.

In some embodiments, the extension of the trenches 345 is performed without the need for a lithography step. That is, in some embodiments, no masking element is formed above the capping layer 343 during the etching process. In some embodiments, the etching process is anisotropic etching such as dry etching. In some embodiments, the etching process has a non-selectivity between the materials to be etched. In some embodiments, the spacer layer 350 protects the storage layer 348 from damage during the etching process. After the removal process, the storage layer 348 over the upper surface of the capping layer 343 may be removed.

The sacrificial vias 332 are removed to form via holes 352 in the IMD layer 326M, as shown in FIGS. 3I-1, 3I-2 and, 3I-3, in accordance with some embodiments. The via holes 352 expose the upper surfaces of the access lines 328M of the top metal layer 328, in accordance with some embodiments. In some embodiments, the removal process includes an etching process, such as dry etching and/or wet etching. Because the material for the sacrificial vias 332 has a higher etching rate than the material for the IMD layer 326M in the etching process, the IMD layer 326M is substantially not etched, in accordance with some embodiments. In some embodiments where the sacrificial vias 332 are made of SiN and the IMD layer 326M is made of $SiO_2$-based or low-K material, the etchant of the etching process is hot phosphoric acid ($H_3PO_4$.). Furthermore, in some embodiments where the insulating layer 342 and the sacrificial layer 332 are made of nitride (e.g., SiN), the capping layer 343 (e.g., oxide) protects the insulating layer 342 and underlying material layers (e.g., the source/drain features and channel features) during the etching process.

In some embodiments, the removal process is performed without the need for a lithography step. That is, in some embodiments, the etching process is a mask-free etching process. As such, the etching process of forming the via holes 352 is a self-aligned etching process, in accordance with some embodiments. Because the sacrificial vias 332 are formed prior to the memory cells, the via holes 352 may be formed without a high aspect ratio etching and the accuracy of the overlay the via holes 352 to the access line 328M may be relatively high. The high aspect ratio etching may reduce the overlay window of via to access line and increase the risk of the damage of the storage layer.

The conductive material 354 is formed over the semiconductor memory device 300, as shown in FIGS. 3J-1, 3J-2, and 3J-3, in accordance with some embodiments. The via holes 352 and the trenches 345 are continuously filled with the conductive material 354, in accordance with some embodiments. The conductive material 354 is also formed over the upper surface of the capping layer 343, in accordance with some embodiments. The conductive material 354 filled into the trenches 345 forms gate structure 358, and the conductive material 354 filled into the via holes 352 forms conductive vias 330M, in accordance with some embodiments. Because the gate structures 358 and conductive via 330M are a continuous structure formed of the conductive material 345, no interface is between the gate structure 358 and conductive vias 330M, in accordance with some embodiments. Furthermore, because the conductive vias 330M are formed by a self-aligned etching process, the overlay window of via to access line may be improved and the risk of the damage of the storage layer may be prevented.

The gate structures 358 are used to form gate lines which provide control gate for memory cells (discussed below). In some embodiments, the source/drain features 335, 339, the channel feature 346, the storage layer 348 and the gate line (formed by the gate structure 358) in combination function as a memory transistor T1, e.g., a SONOS-type flash memory transistor. In some embodiments, the source/drain features 337, 341, the channel feature 346, the storage layer 348 and the gate line (formed by the gate structure 358) in combination function as a memory transistor T2, e.g., a SONOS-type flash memory transistor. In some embodiments, a plurality of pairs of memory transistors T1 and T2 vertically stacked share the same gate line.

In some embodiments, the conductive material 354 is semiconductor material (such as polysilicon or poly-germanium), TiN, W, Co, or another suitable conductive material. In some embodiments, the semiconductor material is doped, e.g., with an n-type or a p-type dopant. In some embodiments, the conductive material 354 is the same as the material for the spacer layer 350. In some embodiments, the conductive material 354 is formed using CVD, PVD ALD, e-beam evaporation, or another suitable process, or another suitable deposition technique.

Figure 3K:
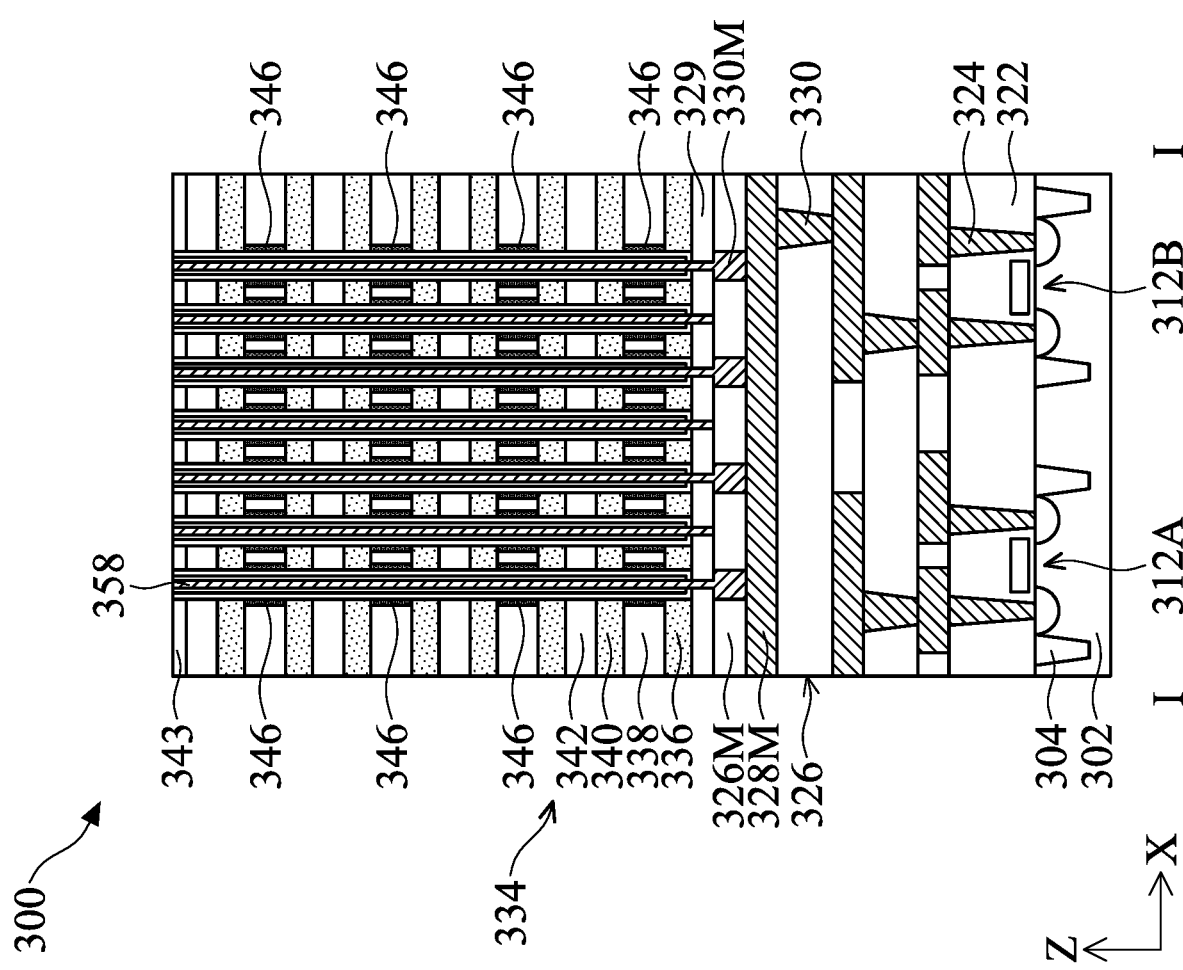

The conductive material 354 formed over the upper surface of the capping layer 343 is removed, as shown in FIG. 3K, in accordance with some embodiments. In some embodiments, the removal process includes an etching-back process and/or planarization process (e.g., CMP). After the removal process, the upper surface of the capping layer 343 is exposed, in accordance with some embodiments.

Figures 2, 3L:
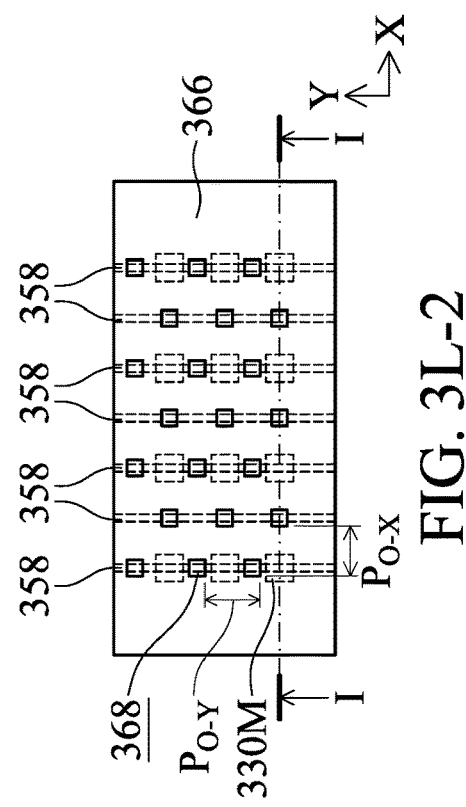
Figures 1, 3L:
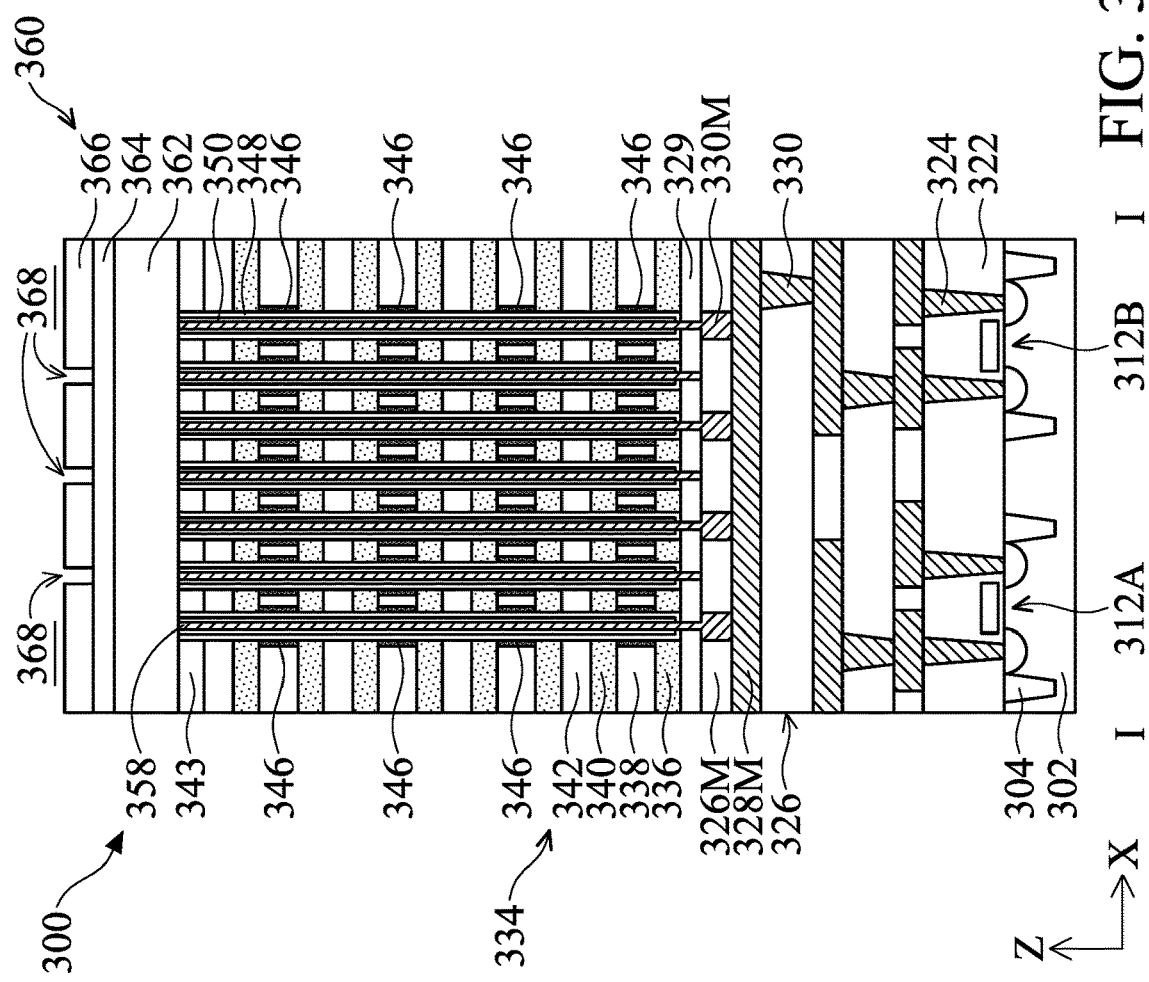
Figures 1, 3M:
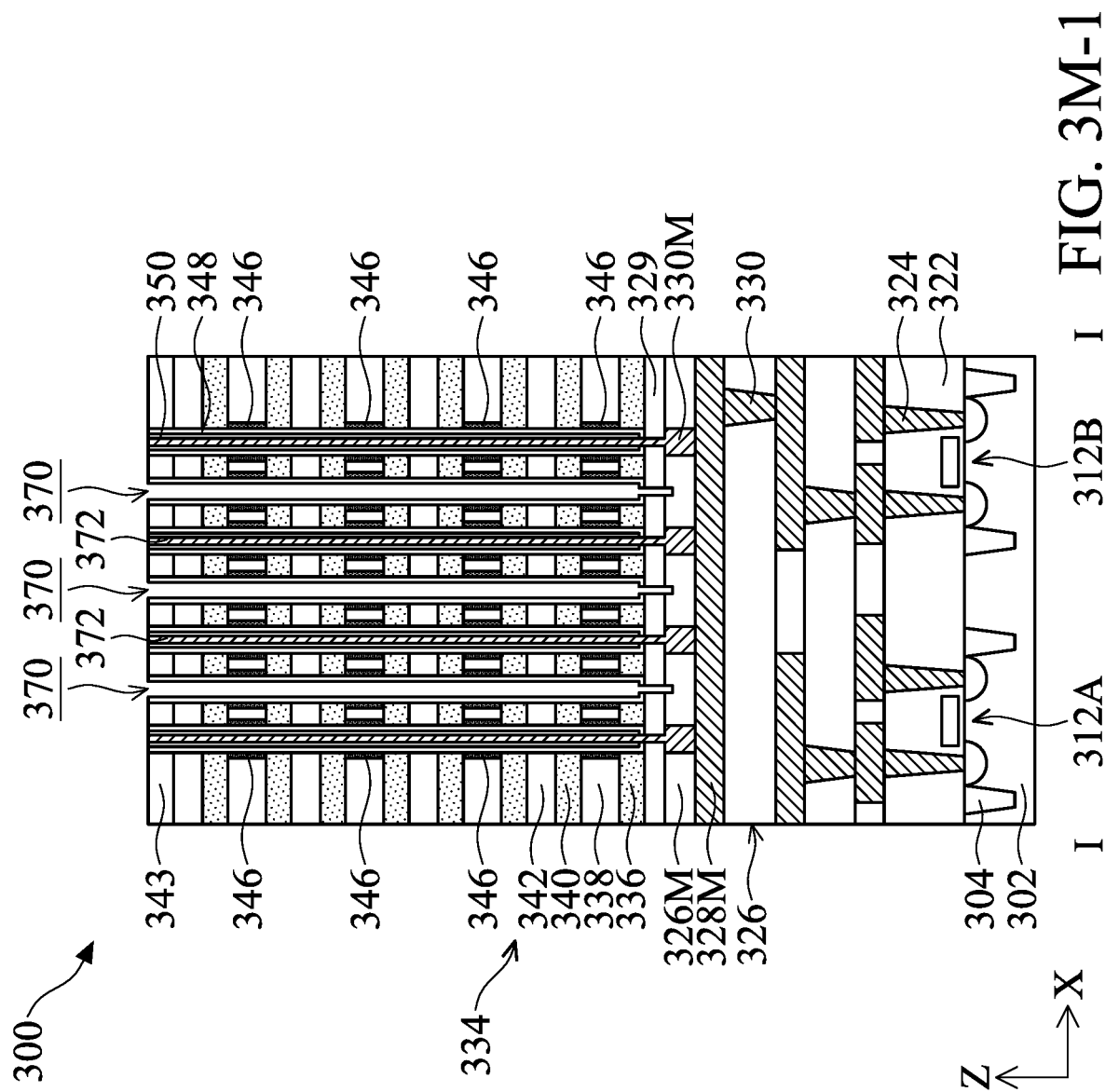
Figures 3, 3M:
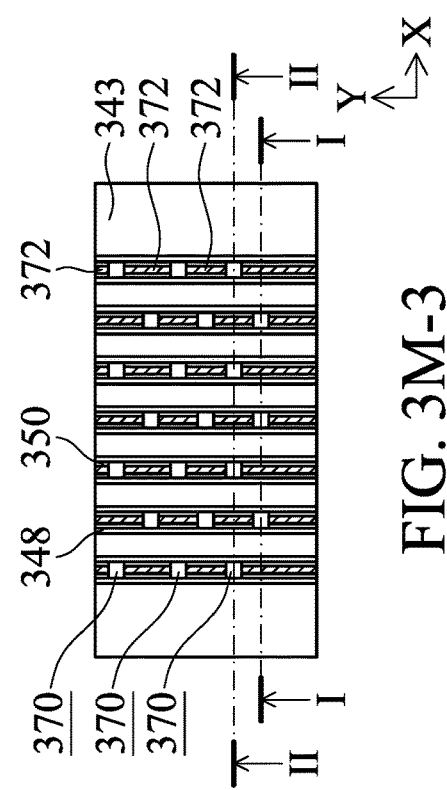
Figures 2, 3M:
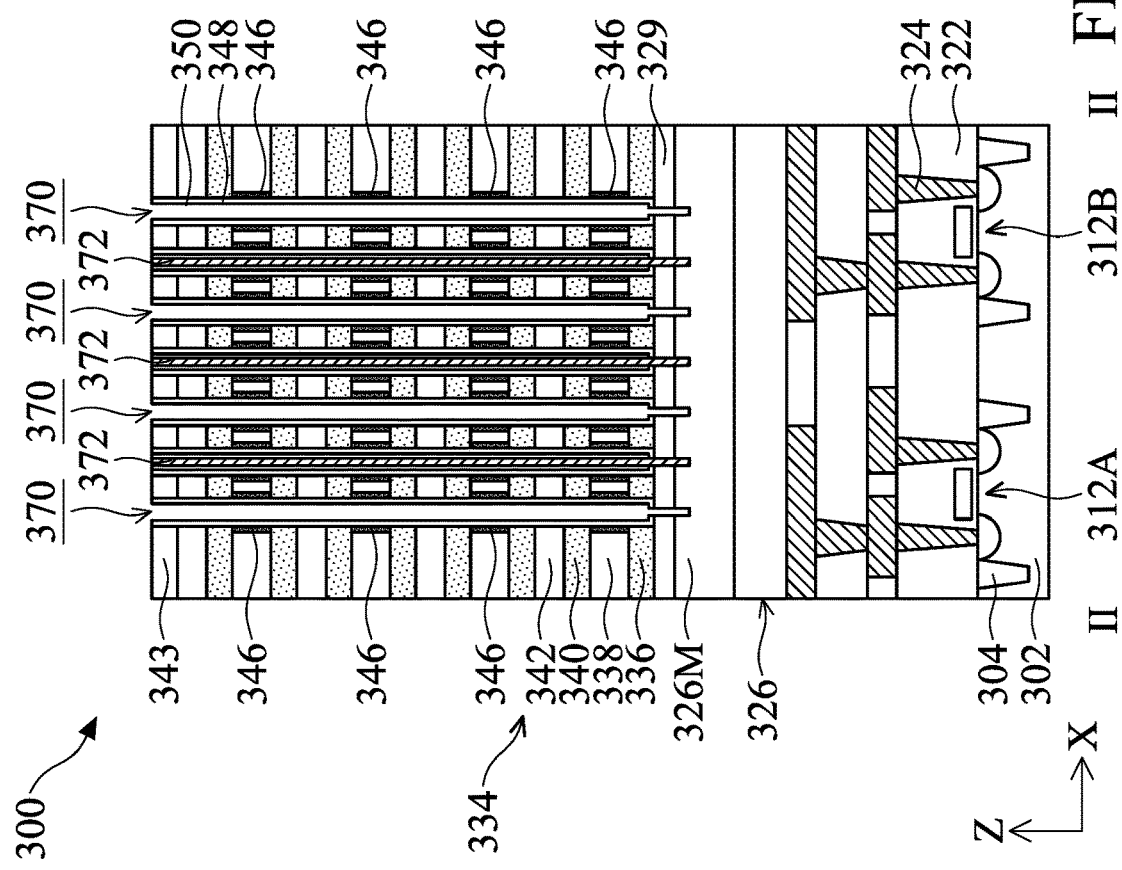
Figures 1, 3N:
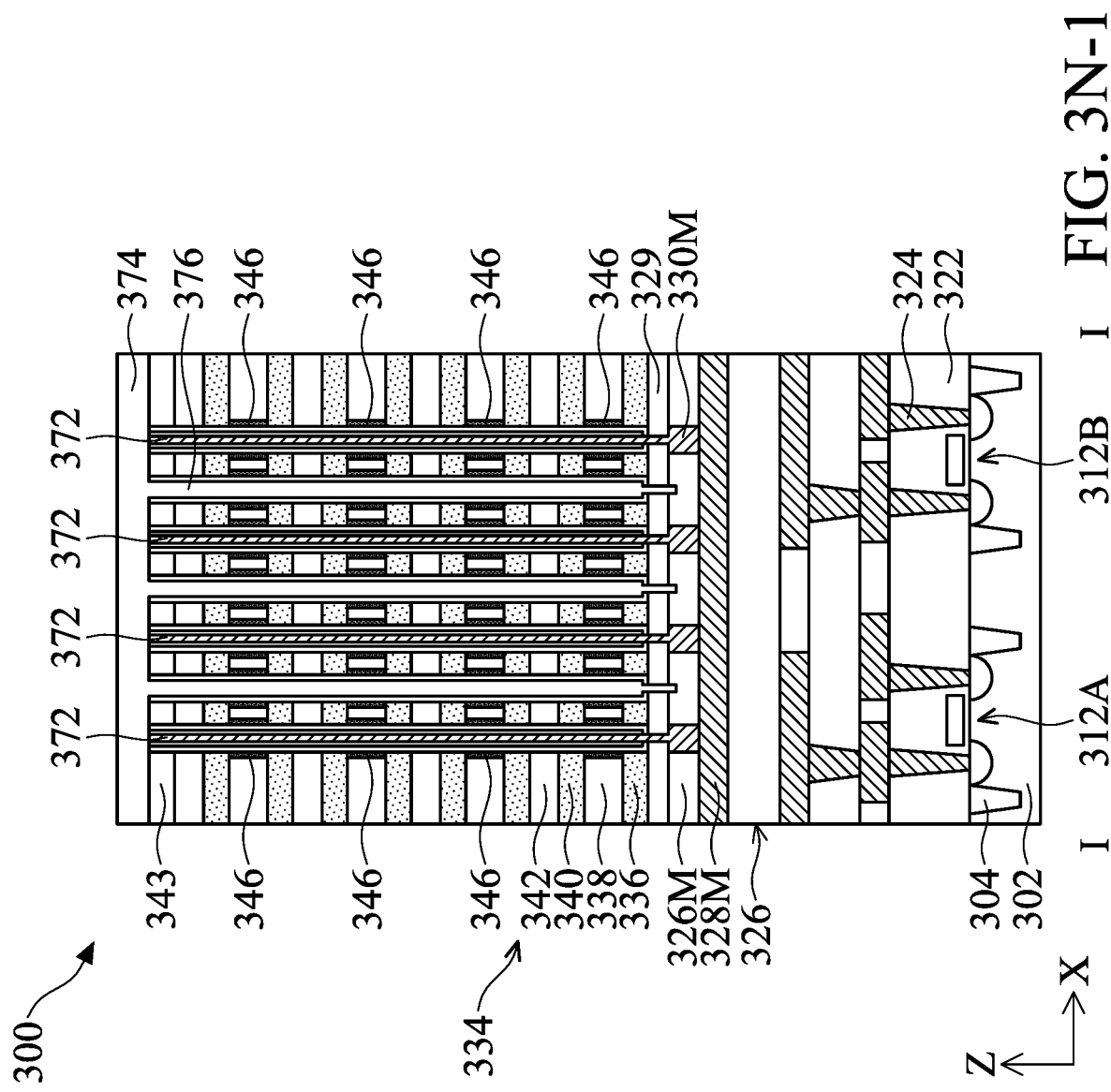
Figures 3, 3N:
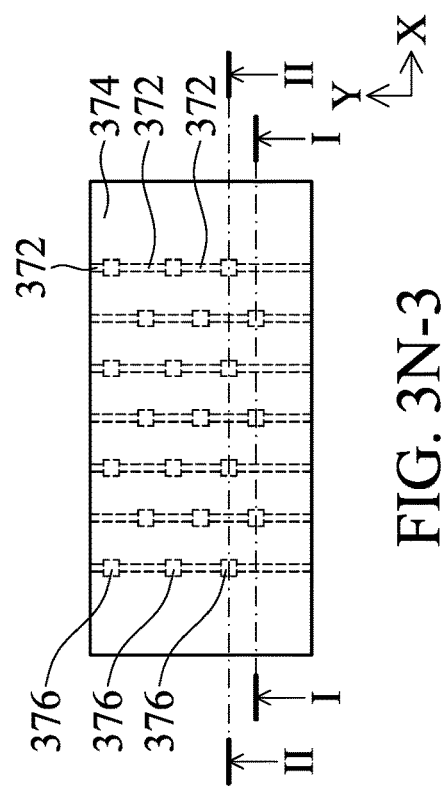
Figures 2, 3N:
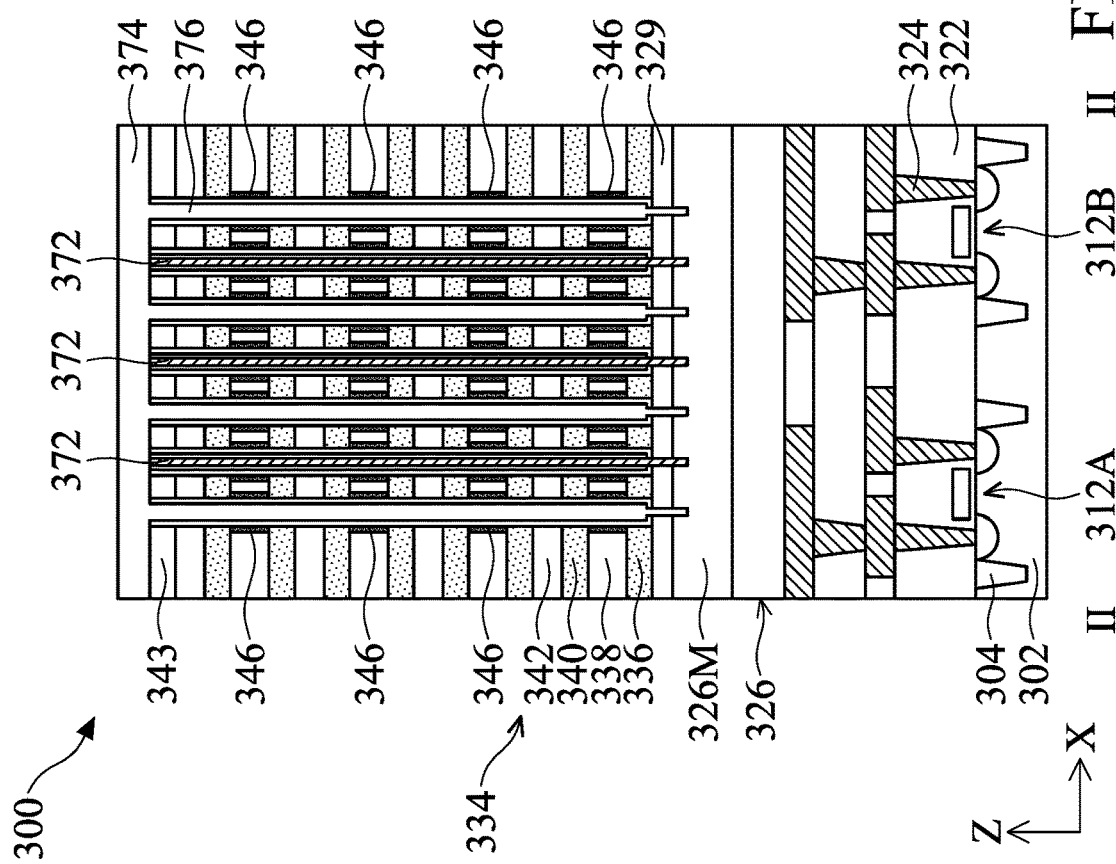
Figures 1, 3O:
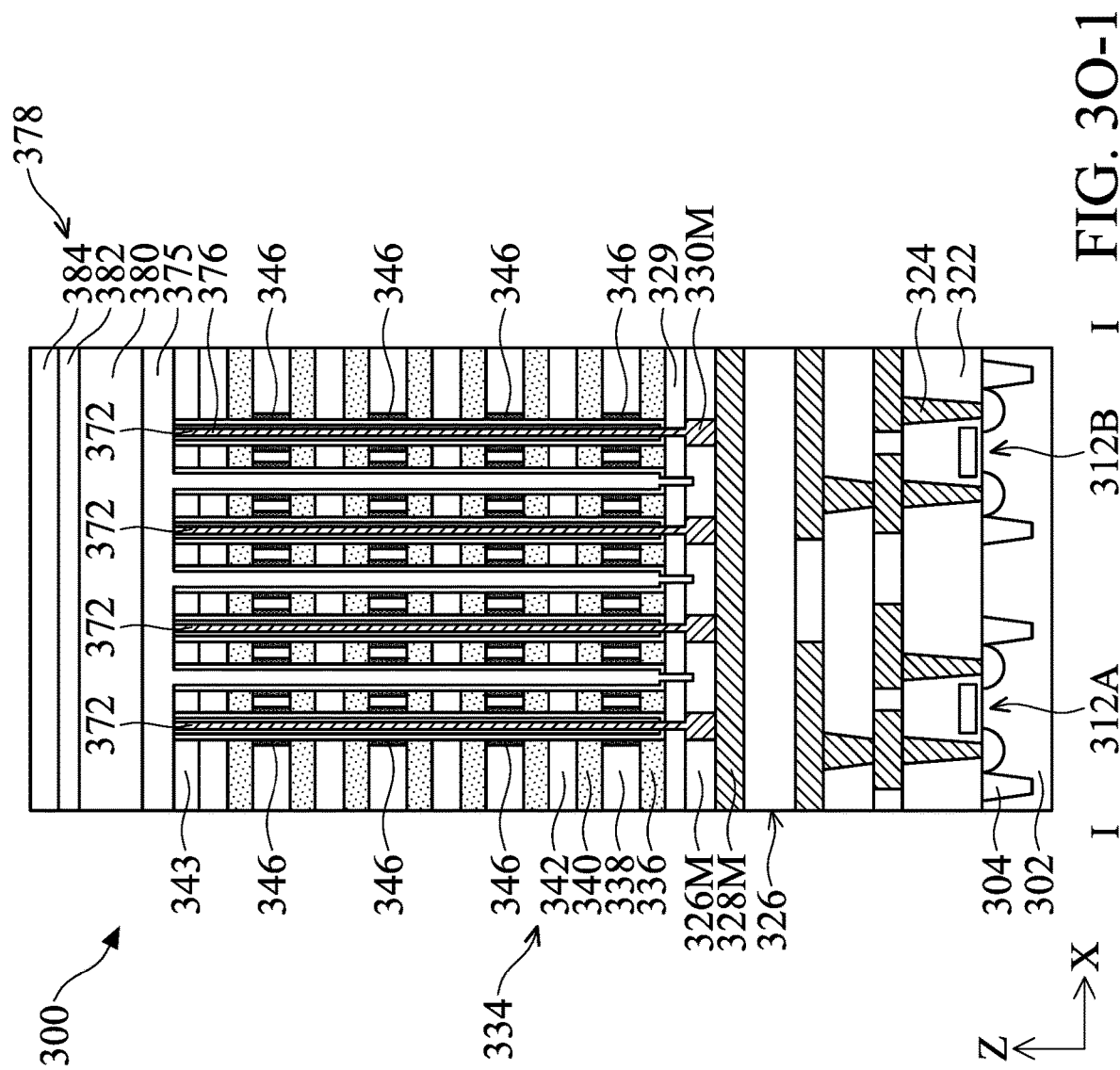
Figures 1, 3P:
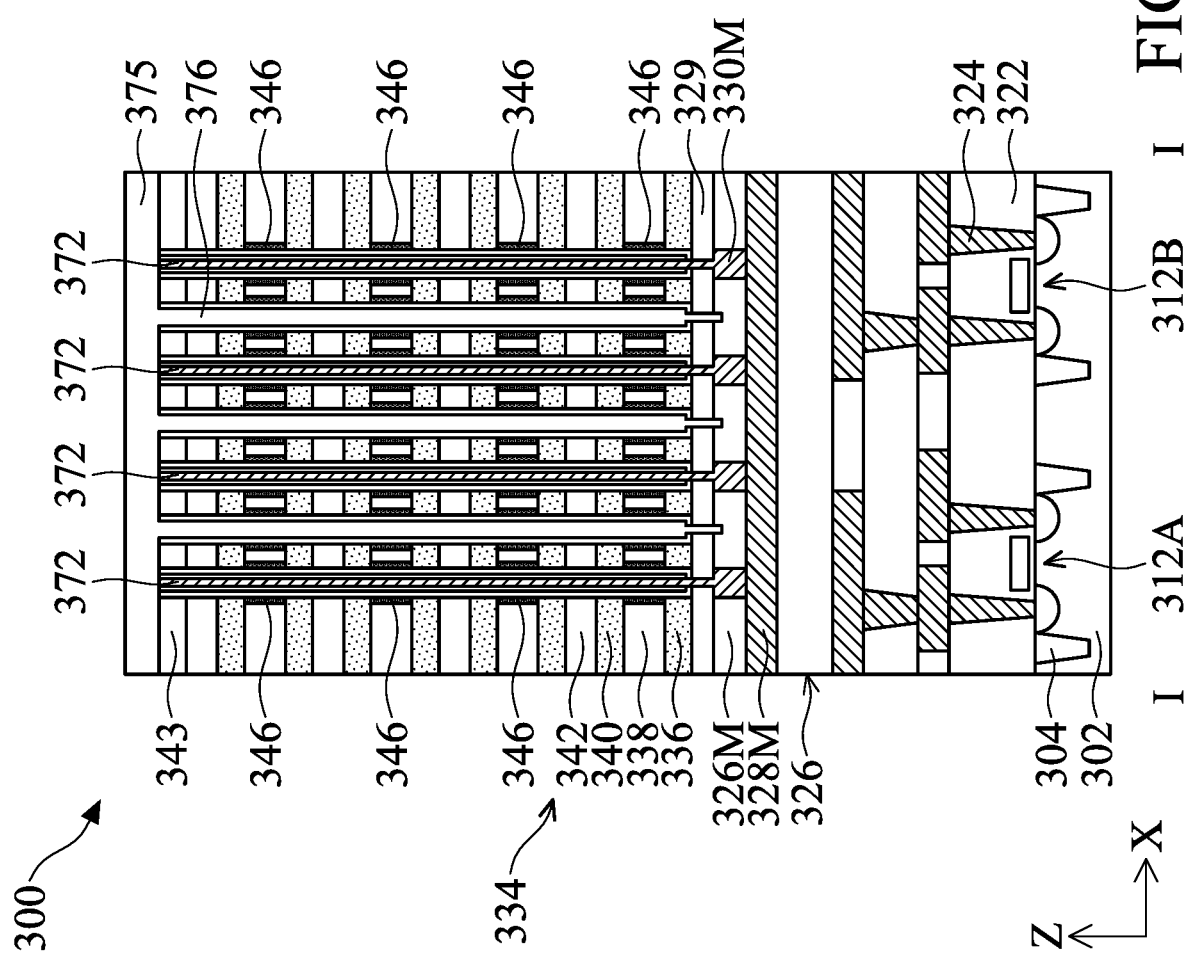
Figures 3, 3P:
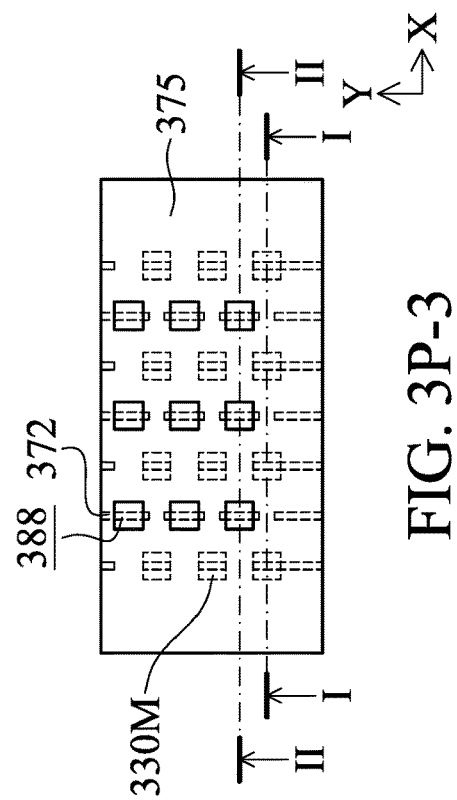
Figures 2, 3P:
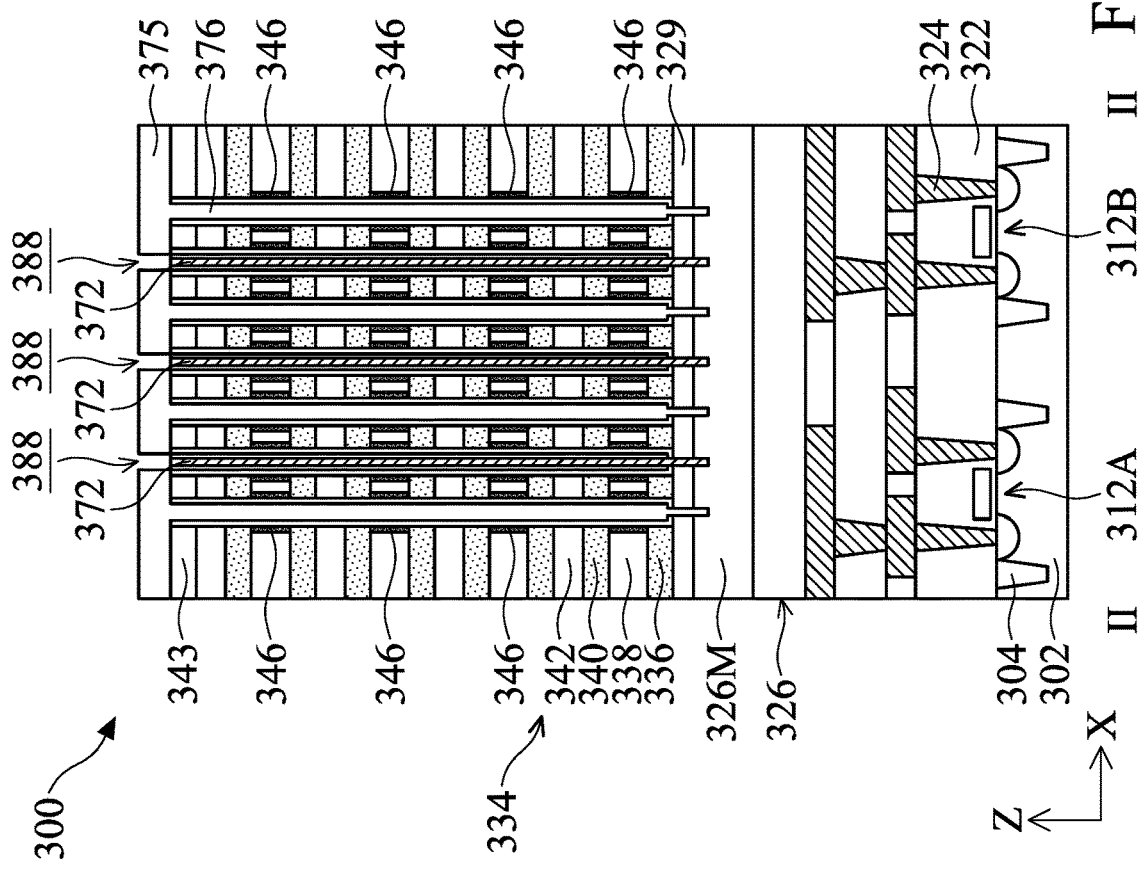
Figures 1, 3Q:
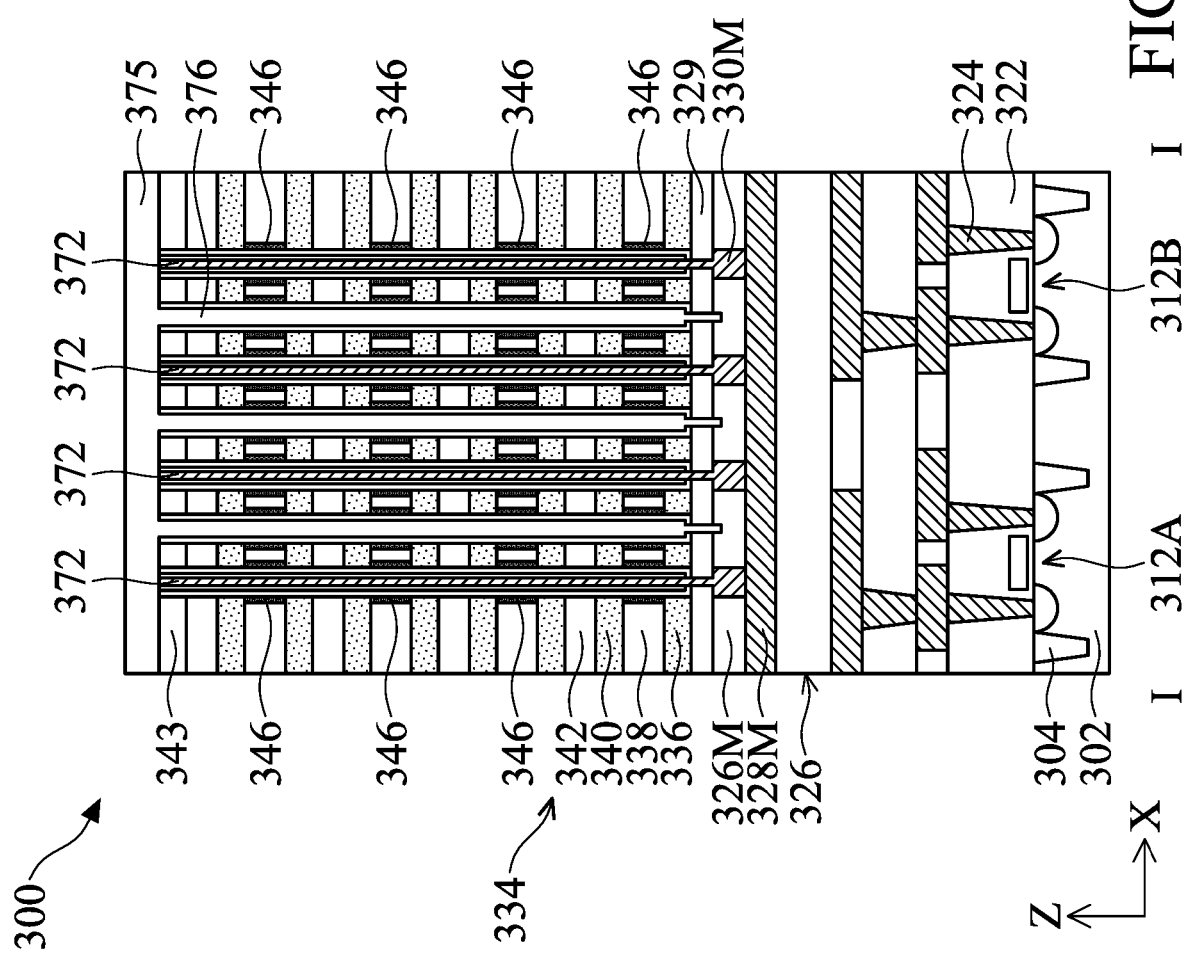
Figures 3, 3Q:
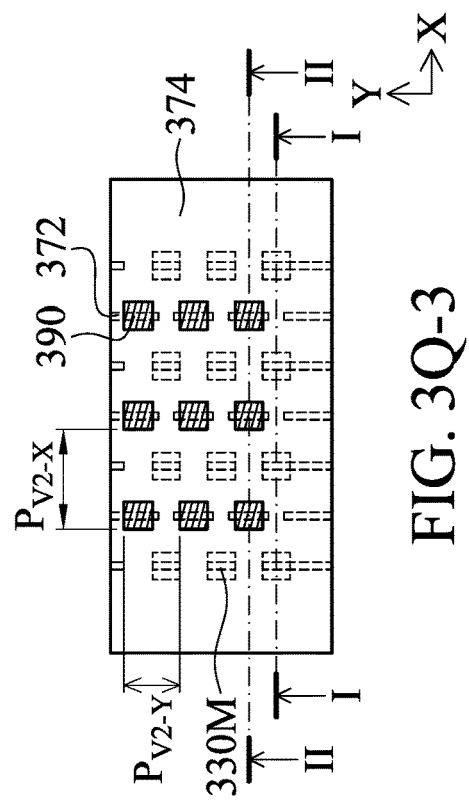
Figures 2, 3Q:
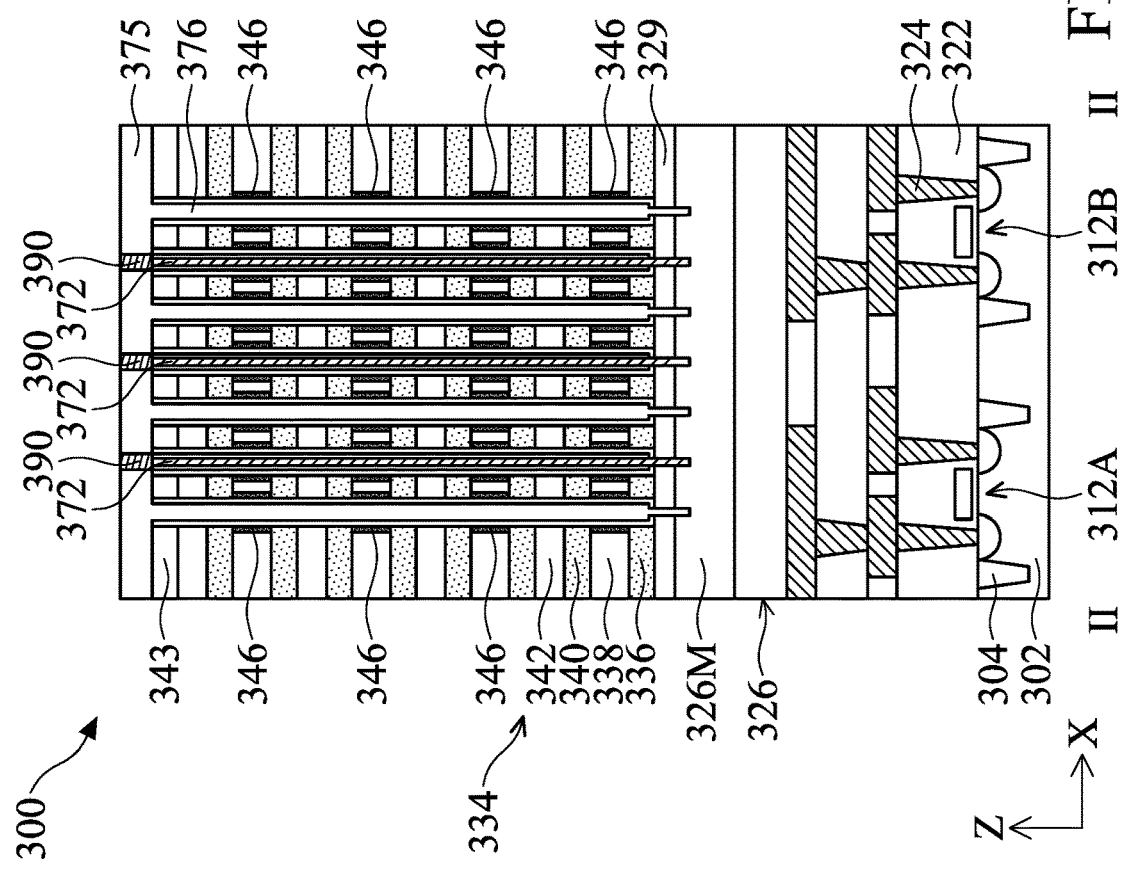

A mask element 360 is formed over the upper surface of the capping layer 343 and the upper surface of the gate structures 358, as shown in FIGS. 3L-1 and 3L-2, in accordance with some embodiments. In some embodiments, the mask element 360 is a tri-layer mask structure which includes a bottom layer 362, a middle layer 364, a top layer 366. In some embodiments, the top layer 366 is a patterned photoresist layer. In some embodiments, the middle layer 364 is made of silicon containing spin-on coated material. In some embodiments, the bottom layer 362 is made of an organic spin-on coated material.

The top layer 366 has a plurality of openings 368, in accordance with some embodiments. The openings 368 are aligned with the gate structure 358, as shown in FIGS. 3L-1 and 3L-2, in accordance with some embodiments. The pattern of the openings 368 will be transferred to the gate structure 358 to cut the gate structure 358, in accordance with some embodiments. The openings 368 are arranged in the X direction and the Y direction, in accordance with some embodiments. The openings 368 over adjacent two gate structures 358 are alternately arranged in the X direction in a staggered manner, as shown in FIG. 3L-2, in accordance with some embodiments. Furthermore, the openings 368 are staggered with the conductive vias 330M, as shown in FIG. 3L-2, in accordance with some embodiments. The openings 368 have an X-pitch $P_{O-X}$ (in the X direction) that is substantially equal to BL pitch (e.g., $P_{a2-X}$) and a Y-pitch $P_{O-Y}$ (in the Y direction) that is substantially equal to WL pitch (e.g., $P_{a1-Y}$), in accordance with some embodiments.

The gate structures 358 are patterned using the mask element 360, in accordance with some embodiments. The pattern of the openings 368 is transferred to the gate structures 358 using an etching process, in accordance with some embodiments. The etching process may be a dry etch process (e.g., plasma enhanced etch) or a wet etching process. Portions of the gate structures 358 aligned below the openings 368 are removed to form openings 370 in the gate structures 358, as shown in FIGS. 3M-1, 3M-2, and 3M-3, in accordance with some embodiments. After the etching process, the mask element 360 is removed, in accordance with some embodiments.

Each of the gate structures 358 is cut into a plurality of gate lines 372 by the openings 370, in accordance with some embodiments. In some embodiments, each of the memory cells C includes a pair of memory transistors T1 and T2 which are interposed by a single gate line 372. Each gate line 372 extends vertically along within a single memory cell column. In some embodiments, the plurality of pairs of the memory transistors T1 and T2 (e.g., memory cells C) are vertically arrayed into a single memory cell columns, and a plurality of memory cell columns are horizontally arrayed into one or more 3D memory cell arrays. As such, the gate lines 372 define the horizontal configuration of the memory transistors T1 and T2, in accordance with some embodiments. The conductive vias 330M are connected to select gate lines 372, in accordance with some embodiments. For example, the conductive via 330M may be connected to every other memory cell and in particular, every other gate line 372 in the X direction.

Furthermore, portions of the spacer layers 350 underlying the openings 368 are also removed. If the portions of spacer layers 350 underlying the openings 368 are not removed completely, the adjacent gate lines 372, formed by the same gate structure 358, may be electrically connected, which may degrade the performance of the semiconductor memory device 300.

An insulating material 374 is formed over the semiconductor memory device 300, as shown in FIGS. 3N-1, 3N-2, and 3N-3, in accordance with some embodiments. The insulating material 374 is filled into the openings 370 to form isolation features 376, in accordance with some embodiments. The isolations feature 376 is used to electrically isolate the gate lines 372 from one another, in accordance with some embodiments. The insulating material 374 is also formed over the upper surface of the capping layer 343 and upper surfaces of the gate lines 372, in accordance with some embodiments.

In some embodiments, the insulating material 374 is a dielectric material, such as an oxide (e.g., $SiO_2$), a nitride (SiN), or another suitable dielectric material. In some embodiments, the insulating material 374 is formed using CVD (such as LPCVD, PECVD, HDP-CVD, HARP, and FCVD), ALD, another suitable method, or a combination thereof.

The insulating material 374, formed over the upper surface of the capping layer 343, may be used as an IMD layer, and is hereinafter referred to as an IMD layer 375, as shown in FIGS. 3Q-1, 3Q-2, and 3Q-3. A mask element 378 is formed over the upper surface of the IMD layer 375, as shown in FIGS. 3O-1, 3O-2, and 3O-3, in accordance with some embodiments. In some embodiments, the mask element 378 is a tri-layer mask structure which includes a bottom layer 380, a middle layer 382, and a top layer 384. In some embodiments, the top layer 384 is a patterned photoresist. In some embodiments, the middle layer 382 is made of silicon containing spin-on coated material. In some embodiments, the bottom layer 380 is made of an organic spin-on coated material.

In some embodiments, the top layer 384 has a plurality of openings 386, as shown in FIGS. 3O-1, 3O-2 and 3L-3. The openings 386 are aligned with the gate line 372, in accordance with some embodiments. The pattern of the openings 382 will be transferred to the IMD layer 375 to define the pattern of conductive vias formed above the memory cell array, in accordance with some embodiments. The conductive vias provide interconnection to the memory cell columns and, in particular, an interconnection to select ones of the gate lines 372 which are not connected to the conductive vias 330M, in accordance with some embodiments. In some embodiments, the openings 382 have a Y-pitch $P_{V2\text{-}Y}$ (in the Y direction) and an X-pitch $P_{V2\text{-}X}$ (in the X direction).

The IMD layer 375 is patterned using the mask element 378, in accordance with some embodiments. The pattern of the openings 378 is transferred to the IMD layer 375 using an etching process, in accordance with some embodiments. The etching process may be a dry etch process (e.g., plasma enhanced etch) or a wet etching process. Portions of the IMD layer 375 aligned below the openings 386 are removed to form via holes 388 in the IMD layer 375, as shown in FIGS. 3P-1, 3P-2, and 3P-3, in accordance with some embodiments. In some embodiments, the openings 388 expose an upper surface of the gate lines 372. After the etching process, the mask element 378 is removed, in accordance with some embodiments.

The conductive vias 390 are formed in the via holes 388 within the IMD layer 375, as shown in FIGS. 3Q-1, 3Q-2, and 3Q-3, in accordance with some embodiments. The conductive vias 390 are formed interfacing select gate lines 372, in accordance with some embodiments. For example, the conductive via 390 may interface every other memory cell and in particular, every other gate line 372 in the X direction.

In some embodiments, the conductive vias 390 have a Y-pitch $P_{V2\text{-}Y}$ (in the Y direction) between adjacent conductive vias 390 that is substantially equal to pitch $P_{a1\text{-}Y}$ of the access lines 328M. In some embodiments, the conductive vias 390 have an X-pitch $P_{V2\text{-}X}$ (in the X direction) between adjacent conductive vias 390. In some embodiments, the X-pitch $P_{V2\text{-}X}$ is twice the BL pitch $P_{a2\text{-}X}$. This relaxed X-pitch $P_{V2\text{-}X}$ is due to the configuration of half of the memory cells being configured to connect to the access line 328M under the memory cell array of through the and half of the memory cells being configured to connect to the metal access line above the memory cell array.

In some embodiments, the conductive vias 390 are made of a conductive material, such as tungsten (W), molybdenum (Mo), titanium (Ti), cobalt (Co), tantalum (Ta), nickel (Ni), polysilicon, aluminum (Al), copper (Cu), silicides, nitrides, and/or another suitable material. In some embodiments, the conductive vias 390 are formed using a deposition process (e.g., CVD, PVD, e-beam evaporation, electroplating, etc.) followed by a planarization process (e.g., CMP).

An IMD layer 391 is formed over the upper surface of the IMD layer 375 and the upper surfaces of the conductive vias 390, as shown in FIGS. 3R-1, 3R-2, and 3R-3, in accordance with some embodiments. The metal layer 392 is formed in the IMD layer 391, in accordance with some embodiments. The metal layer 392 includes access lines 392N (or referred to top access lines 392N), in accordance with some embodiments. The access lines 392N are formed over and contact the conductive vias 390, in accordance with some embodiments. The access lines 392N extend in the X direction, in accordance with some embodiments. The access lines 392N are arranged in the Y direction and spaced from one another, in accordance with some embodiments. The access lines 392N are conductive lines operable to access and/or control other half of memory cells of the memory cell array, in accordance with some embodiments.

Figures 1, 3R:
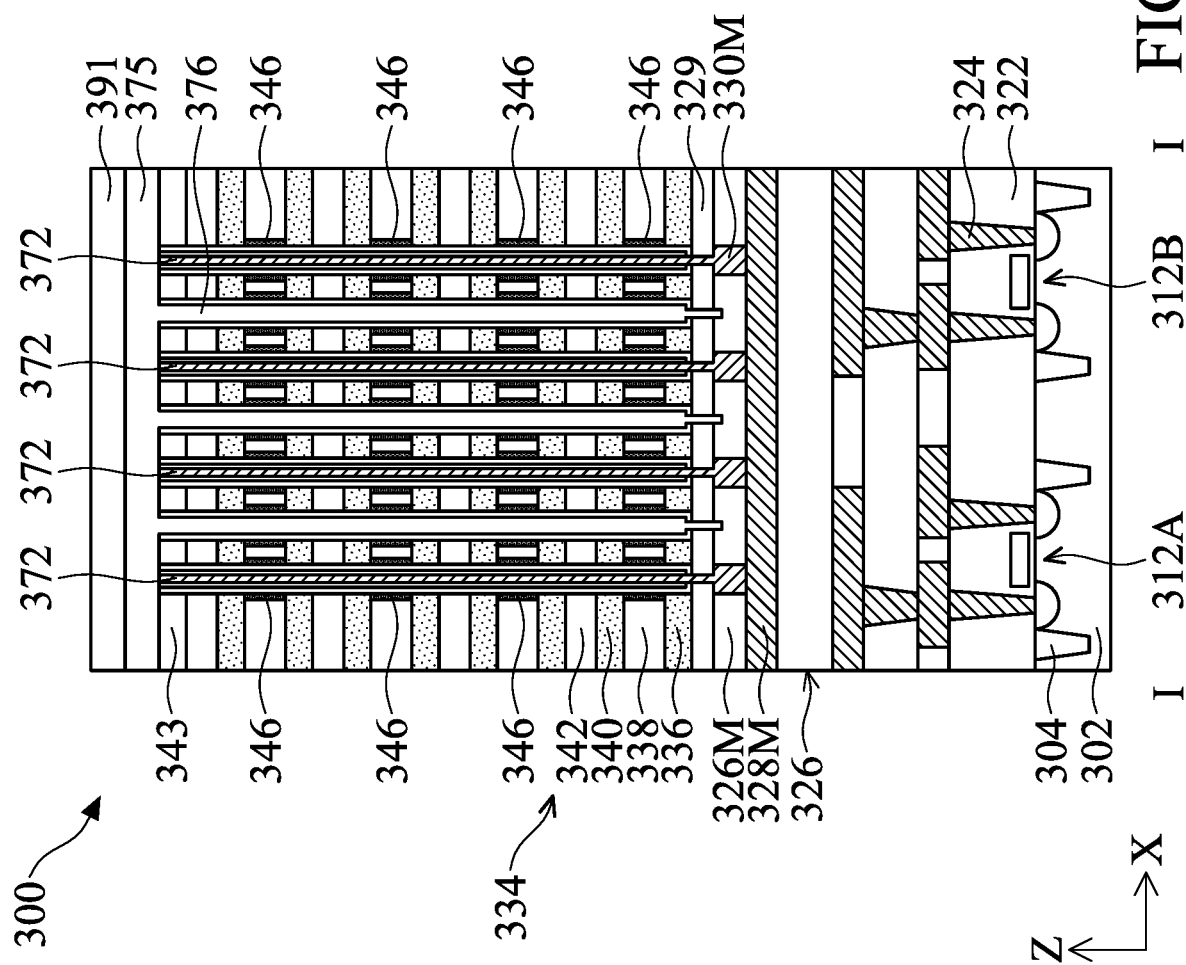
Figures 2, 3, 3R:
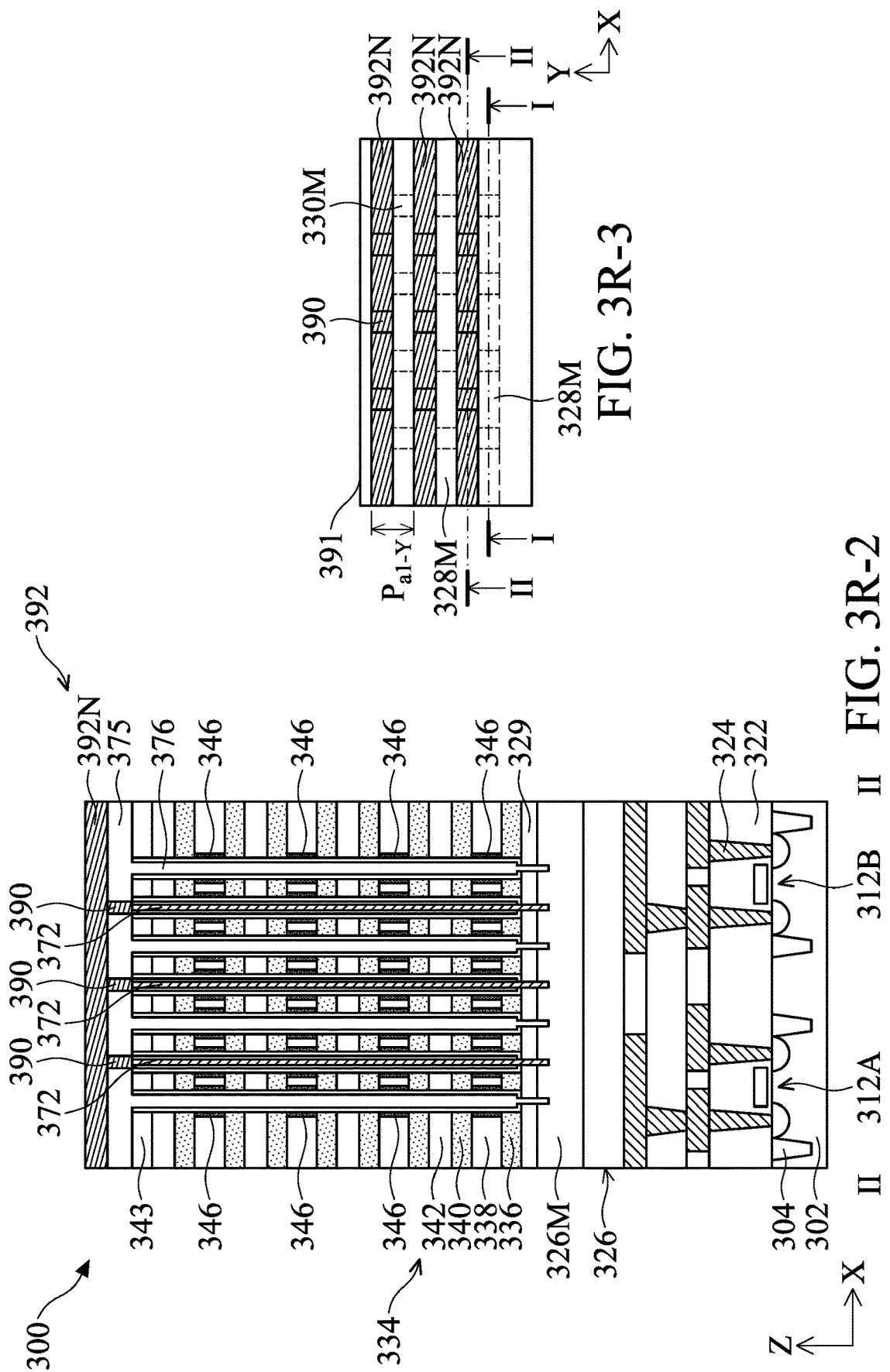

In some embodiments, the access lines 392N are word lines (WL) and have a pitch $P_{a1\text{-}Y}$ in the Y direction between adjacent word lines. In some embodiments, the access lines 392N and 328M provide the same functionality (e.g., both provide word lines). In some embodiments, half of the gate lines 372 are connected to the top access line 392N and other half of the gate lines 372 are connected to the bottom access lines 328M. In some embodiments, every other gate line 378 (in the x-direction) is connected to the top access line 392N, and the remaining gate lines 378 (in the x-direction) are connected to the bottom access lines 328M, as shown in FIGS. 3R-1 and 3R-2. In some embodiments, the access lines 392N are provided to a first grouping of memory cells, and the access lines 328M are provided to a second grouping of memory cells, as described above with respect with FIGS. 2A and 2B. In some embodiments, the access lines 392N are bit lines (BL). It should be noted that whether the access lines 392N are word lines or bit lines is dependent on the desired configuration of the memory cells.

In some embodiments, the material and the formation of the IMD layer 391 is the same or similar to that of the IMD layers 326. In some embodiments, the metal layer 392N are made of a conductive material, such as tungsten (W), molybdenum (Mo), titanium (Ti), cobalt (Co), tantalum (Ta), nickel (Ni), polysilicon, aluminum (Al), copper (Cu), silicides, nitrides, and/or another suitable material. In some embodiments, the formation of the metal layer 392 is the same as or similar to that of the metal layer 328.

Additional IMD layers and additional metal layers and vias may be formed over the IMD layer 391. In addition, the top access lines 392N routed on the metal layer 392 may be interconnected to the peripheral circuit component (e.g., logic devices 312A and 312B) through an interconnect structure (e.g., the interconnect structure 320) in another region (not shown) of the substrate 302.

As described above, the semiconductor memory device 300 includes the bottom access lines 328M that are disposed under a memory cell array and provided to select ones of the memory cells C, in particular, half of the gate lines 372, through the conductive vias 330M, and thus the pitch required for the access lines 328M is relaxed, which allows for improved scalability of the array, in accordance with some embodiments.

Figures 1, 2, 4:
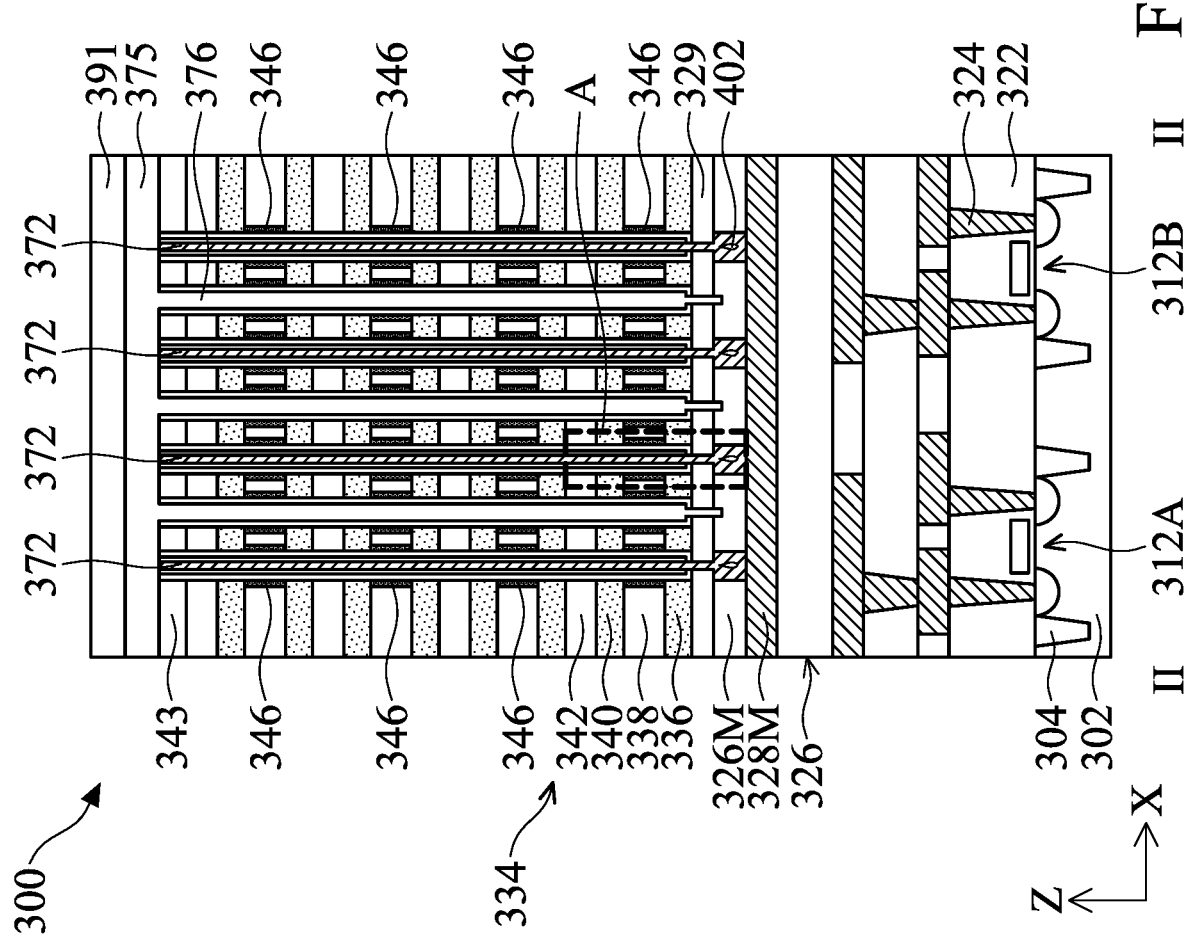

FIG. 4-1 is a cross-sectional view of a semiconductor memory device 300, in accordance with some embodiments of the disclosure. FIG. 4-2 is an enlarged view of area A shown in FIG. 4-1, in accordance with some embodiments of the disclosure.

In some embodiments, the conductive vias 330M (formed from the sacrificial vias 332) have a width W1 and the gate lines 372 have a width W2 that is less than the width W1 thereby improving the gate line to via overlay window. Furthermore. air voids 402 are formed in the conductive material of the conductive vias 330M during the filling of the conductive material 354 into the via holes 352, in accordance with some embodiments. The air voids 402 has a dimension (e.g., the maximum width) W2 that is about 0.5 to about 1.5 of the difference between width W1 and width W2 (W1 minus W2). In some embodiments, the dimension W2 of the air voids 402 is small enough, and thus the resistance of the conductive vias 330M does not substantially change.

As described above, the method for forming a semiconductor memory device includes forming a sacrificial via 332 in an IMD layer 326M over a substrate 302, forming a stack of layers 334 for a memory cell array over the IMD layer 326M, forming a trench 345 through the stack of layers 334 and corresponding to the sacrificial via 332, removing the sacrificial via 332 to form a via hole 352 in the IMD layer 326M, and filling the trench 345 and the via hole 352 with a conductive material 354 to form a gate line 372 and a conductive via 330M. The sacrificial via 332 is formed prior to the memory cells, and the sacrificial via 332 is removed without the need for a lithography step. As a result, the overlay window of via to access line can be improved, high aspect ratio etching can be avoided, and the risk of the damage of the storage layer of the memory transistors may be prevented. Therefore, the production yield of the semiconductor memory device can be increased.

Embodiments of a method for forming a semiconductor memory device may be provided. The method may include forming a sacrificial via in a dielectric layer over a substrate, forming a stack of layers for a memory cell array over the dielectric layer, forming a trench through the stack of layers and corresponding to the sacrificial via, removing the sacrificial via to form a via hole in the dielectric layer, and filling the trench and the via hole with a conductive material. As a result, the overlay window of via to access line may be improved, high aspect ratio etching may be avoided, and the risk of the damage of the storage layer of the semiconductor memory device may be prevented. Therefore, the production yield of the semiconductor memory device may be increased.

In some embodiments, a semiconductor memory device is provided. The semiconductor memory device includes a via above a substrate, a dielectric layer over the via, a first source/drain feature above the dielectric layer, a first channel feature above the first source/drain feature, a second source/drain feature above the first channel feature, and a gate line laterally spaced apart from the first source/drain feature, the first channel feature and the second source/drain feature. The gate line passes through the dielectric layer and is on the via.

In some embodiments, a semiconductor memory device is provided. The semiconductor memory device includes a first word line in a first dielectric layer, and a plurality of stacks vertically arranged over the first dielectric layer. Each of the stack includes an insulating layer vertically interposing between a first semiconductor layer and a second semiconductor layer. The semiconductor memory device also includes a plurality of first gate lines passing through the plurality of stack and in electrical connection with the first word line, a plurality of second gate lines passing through the plurality of stacks, a second dielectric layer over the plurality of stacks, the first gate lines and the second gate lines, and a second word line in the second dielectric layer. The plurality of second gates are in electrical connection with the second word line.

In some embodiments, a semiconductor memory device is provided. The semiconductor memory device includes a logic device on a substrate, and an interconnect structure over the logic device. The interconnect structure includes an access line and a conductive via on the first access line. The semiconductor memory device also includes a memory cell over the interconnect structure, and a gate line vertically extending along the memory cell and above the conductive via. The gate line connects the memory cell to the first access line. The conductive via and the gate line are formed of a continuous conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device, comprising:
   a via above a substrate;
   a dielectric layer over the via;
   a first source/drain feature above the dielectric layer;
   a first channel feature above the first source/drain feature;
   a second source/drain feature above the first channel feature; and
   a gate line laterally spaced apart from the first source/drain feature, the first channel feature and the second source/drain feature, wherein the gate line passes through the dielectric layer and is on the via.

2. The semiconductor memory device as claimed in claim 1, further comprising:
   a storage layer between the first channel feature and the gate line, wherein the storage layer comprises oxide-nitride-oxide configuration.

3. The semiconductor memory device as claimed in claim 2, further comprising:
   a spacer layer between the storage layer and the gate line, wherein the spacer layer is separated from the dielectric layer by a bottom potion of the storage layer.

4. The semiconductor memory device as claimed in claim 3, wherein the spacer layer is made of conductive material.

5. The semiconductor memory device as claimed in claim 1, wherein a sidewall of the first source/drain feature, a sidewall of the second source/drain feature and a sidewall of the first channel feature are substantially level.

6. The semiconductor memory device as claimed in claim 1, further comprising:
   a second channel feature vertically between the first source/drain feature and the second source/drain feature; and
   an insulating layer laterally between the first channel feature and the second channel feature.

7. The semiconductor memory device as claimed in claim 1, further comprising:
   a third source/drain feature above the dielectric layer;
   a second channel feature above the third source/drain feature; and
   a fourth source/drain feature above the second channel feature, wherein the first source/drain feature, the first channel feature and the second source/drain feature are located at a first side of the gate line, and the third source/drain feature, the second channel feature and the fourth source/drain feature are located at a second side of the gate line that is opposite to the first side.

8. The semiconductor memory device as claimed in claim 1, further comprising:
   an isolation feature adjacent to the first source/drain feature, the first channel feature and the second source/drain feature, wherein a bottom surface of the isolation feature is lower than a bottom surface of the dielectric layer.

9. The semiconductor memory device as claimed in claim 1, wherein a width of the via is greater than a width of the gate line.

10. A semiconductor memory device, comprising:
    a first word line in a first dielectric layer;

a plurality of stacks vertically arranged over the first dielectric layer, each of the stacks comprising an insulating layer vertically interposing between a first semiconductor layer and a second semiconductor layer;

a plurality of first gate lines passing through the plurality of stacks and in electrical connection with the first word line;

a plurality of second gate lines passing through the plurality of stacks;

a second dielectric layer over the plurality of stacks, the first gate lines and the second gate lines; and a second word line in the second dielectric layer, wherein the second gate lines are in electrical connection with the second word line.

11. The semiconductor memory device as claimed in claim 10, wherein in a top view, the first word line and the second word line stagger with each other.

12. The semiconductor memory device as claimed in claim 10, wherein the first gate lines are electrically isolated from the second word line, and the second gate lines are electrically isolated from the first word line.

13. The semiconductor memory device as claimed in claim 10, further comprising:

a plurality of isolation features passing through the plurality of stacks, wherein the plurality of isolation features and the plurality of first gate lines are alternatingly arranged.

14. The semiconductor memory device as claimed in claim 13, wherein the isolation features correspond to and are in contact with the second gate lines respectively.

15. The semiconductor memory device as claimed in claim 10, further comprising:

a peripheral circuit region over a substrate, wherein the first dielectric layer is formed over the peripheral circuit region.

16. A semiconductor memory device, comprising:

a logic device on a substrate;

an interconnect structure over the logic device, comprising an access line and a conductive via on the access line;

a memory cell over the interconnect structure; and a gate line vertically extending along the memory cell and above the conductive via, wherein the gate line connects the memory cell to the access line, wherein the conductive via and the gate line are formed of a continuous conductive material.

17. The semiconductor memory device as claimed in claim 16, wherein the conductive via is wider than the gate line.

18. The semiconductor memory device as claimed in claim 16, wherein the memory cell comprises flash memory transistors which are interposed by the gate line.

19. The semiconductor memory device as claimed in claim 16, wherein the conductive via has an air void in the conductive material.

20. The semiconductor memory device as claimed in claim 19, wherein the conductive via has a first width, the gate line has a second width, and the air void has a third width, and the third width is 0.5 to 1.5 of the difference between the first width and the second width.

* * * * *